United States Patent
Khor et al.

(10) Patent No.: US 8,666,013 B1
(45) Date of Patent: Mar. 4, 2014

(54) TECHNIQUES FOR CLOCK DATA RECOVERY

(75) Inventors: Chuan Thim Khor, Teluk Intan (MY); Teng Chow Ooi, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 395 days.

(21) Appl. No.: 13/053,797

(22) Filed: Mar. 22, 2011

(51) Int. Cl.
 *H04L 7/033* (2006.01)
 *H03L 7/06* (2006.01)

(52) U.S. Cl.
 USPC .......................................... 375/376; 327/147

(58) Field of Classification Search
 USPC .......... 375/327, 373–376; 327/146–148, 151, 327/155–157
 See application file for complete search history.

(56) References Cited

U.S. PATENT DOCUMENTS

| | | | |
|---|---|---|---|
| 7,443,215 B1 * | 10/2008 | Sidiropoulos | 327/156 |
| 2004/0022339 A1 * | 2/2004 | Nakao | 375/376 |
| 2006/0062341 A1 * | 3/2006 | Edmondson et al. | 375/376 |
| 2008/0080605 A1 | 4/2008 | Tan et al. | |
| 2008/0175310 A1 * | 7/2008 | Okamura et al. | 375/232 |
| 2009/0245449 A1 * | 10/2009 | Umai et al. | 375/376 |
| 2010/0283525 A1 | 11/2010 | Yoshikawa | |
| 2010/0315135 A1 | 12/2010 | Lai et al. | |
| 2011/0064176 A1 * | 3/2011 | Takada | 375/355 |
| 2012/0033773 A1 * | 2/2012 | Nedovic | 375/371 |
| 2012/0109356 A1 * | 5/2012 | Kong et al. | 700/121 |

OTHER PUBLICATIONS

Ming-ta Hsieh et al., "Clock and Data Recovery with Adaptive Loop Gain for Spread Spectrum SerDes Applications," Proceedings, IEEE International Symposium on Circuits and Systems, pp. 4883-4886, 2005.

Chin-Hsien Lin et al., "6 Gb/s Digitally Phase Adjusted Clock Data Recovery for Spread Spectrum Clock," Proc. 18th VLSI Design/ CAD Symposium, Aug. 2007, pp. 668-671.

* cited by examiner

*Primary Examiner* — Young T. Tse
(74) *Attorney, Agent, or Firm* — Steven J. Cahill

(57) ABSTRACT

A clock data recovery circuit includes a phase detector circuit, a filter circuit, a parts per million (PPM) detector circuit, a PPM decoder circuit, a summation circuit, and a phase interpolator circuit. The phase detector circuit generates a phase error signal based on a periodic signal and a data signal. The filter circuit generates a filtered signal based on the phase error signal. The PPM detector circuit and the PPM decoder circuit generate control signals based on the filtered signal. The phase interpolator circuit generates the periodic signal. The clock data recovery circuit adjusts a phase of the periodic signal based on the filtered signal and the control signals in response to variations in a data rate of the data signal using spread-spectrum clocking in order to track changes in the data rate of the data signal.

24 Claims, 18 Drawing Sheets

TECHNIQUES FOR CLOCK DATA RECOVERY

FIELD OF INVENTION

The present invention relates to electronic circuits, and more particularly, to techniques for clock data recovery.

BACKGROUND

Synchronous digital systems are electronic systems that are driven by one or more clock signals. Because a clock signal is periodic, a clock signal has a narrow frequency spectrum. Synchronous digital systems generate electromagnetic energy on narrow frequency bands that include the frequency of the clock signal and its harmonics. The frequency spectrum of the clock signal and its harmonics may exceed desirable limits for electromagnetic interference at certain frequencies.

Some synchronous digital systems use spread-spectrum techniques to reduce electromagnetic interference. In a synchronous digital system that uses a spread-spectrum technique, the bandwidth of a signal is spread in the frequency domain to generate a signal having a wider bandwidth. Spread-spectrum techniques reduce the peak energy radiated by the system.

Some synchronous digital systems use spread-spectrum clocking (SSC). Serial AT-Attachment (SATA) and DisplayPort are examples of interface standards for electronic devices that require spread-spectrum clocking (SSC). As an example, a data transmission system that transmits a data signal from a transmitter to a receiver according to the SATA 2.0 standard using a spread-spectrum technique and a modulation frequency of 30-33 kilohertz (kHz) has a triangular down-spreading profile that varies between 0 and 5000 parts per million (PPM) of a unit interval of the data signal. In this example, the data rate of the data signal transmitted by the transmission system varies between 3.0 gigabits per second (Gbps) and 2.97 Gbps over time in a triangular waveform.

BRIEF SUMMARY

According to some embodiments, a clock data recovery circuit includes a phase detector circuit, a filter circuit, and a phase interpolator circuit. The phase detector circuit generates a phase error signal based on a periodic signal and a data signal. The filter circuit generates a filtered signal based on the phase error signal. The phase interpolator circuit generates the periodic signal. The clock data recovery circuit adjusts a phase of the periodic signal based on the filtered signal in response to variations in a data rate of the data signal using spread-spectrum clocking in order to track changes in the data rate of the data signal.

Various objects, features, and advantages of the present invention will become apparent upon consideration of the following detailed description and the accompanying drawings.

DETAILED DESCRIPTION

A high-speed digital data signal can be transmitted through transmission lines to a receiver without an accompanying clock signal. A clock data recovery (CDR) circuit in the receiver generates one or more clock signals from an approximate frequency reference signal, and then phase-aligns the clock signals to the transitions in the data signal. The receiver uses the clock signals to sample data bits in the data signal. Previously known clock data recovery circuits only adjust the phases of the clock signals to match small changes in the phase of the data signal. Previously known clock data recovery circuits are not designed to adjust the phases of the clock signals by large enough phase shifts to match changes in the data rate of the data signal (e.g., between 2.97 Gbps and 3.0 Gbps) that are generated by a data transmission system using a spread-spectrum technique.

Figure 1:
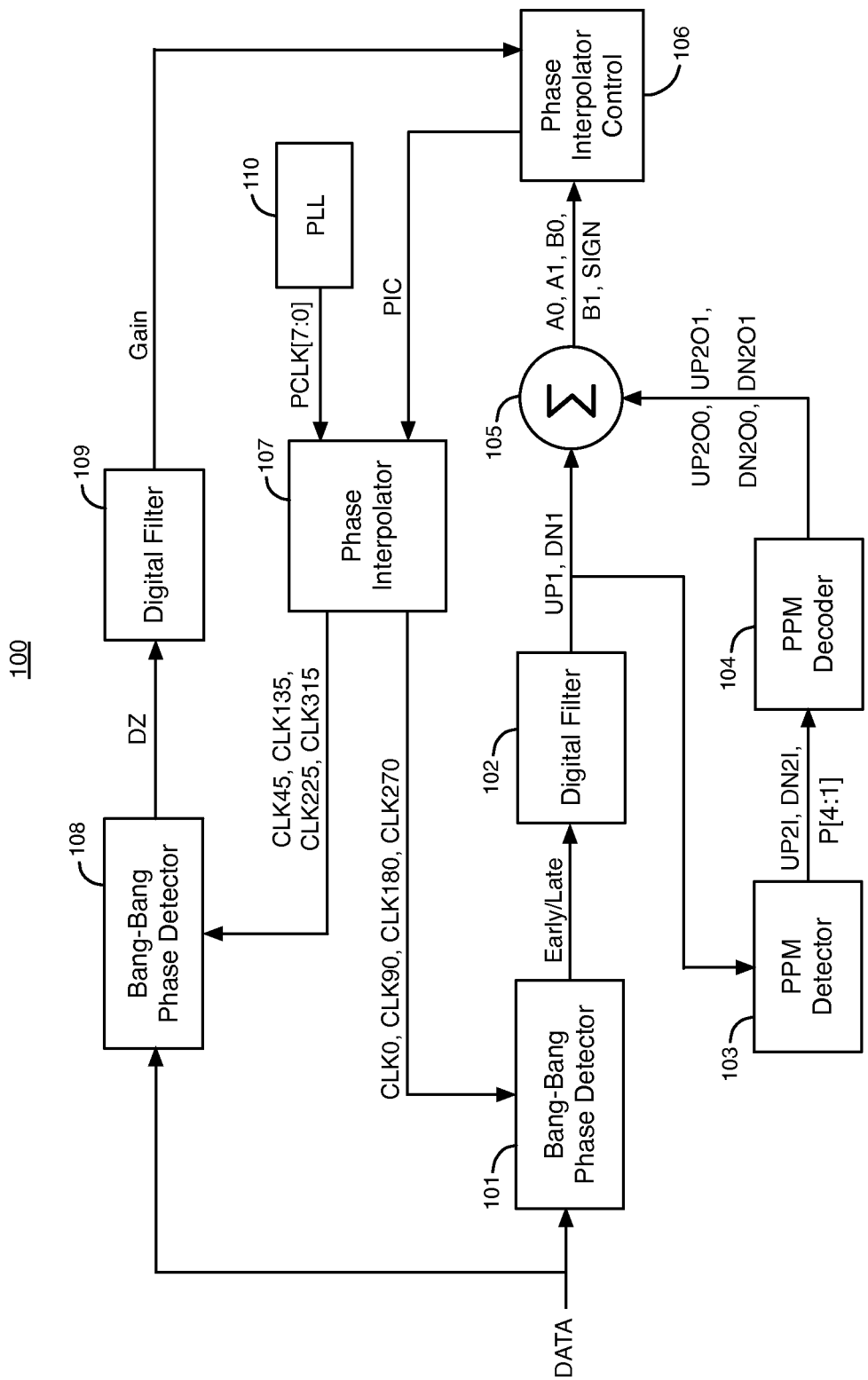
FIG. 1 illustrates an example of a clock data recovery (CDR) circuit, according to an embodiment of the present invention.

FIG. 1 illustrates an example of a clock data recovery (CDR) circuit 100, according to an embodiment of the present invention. CDR circuit 100 is typically fabricated in an integrated circuit such as, for example, an application specific integrated circuit (ASIC), a field programmable gate array (FPGA), a programmable logic device (PLD), a memory integrated circuit, a processor or controller integrated circuit, an analog integrated circuit, etc.

CDR circuit 100 includes bang-bang phase detector (BBPD) circuit 101, digital filter circuit 102, parts per million (PPM) detector circuit 103, PPM decoder circuit 104, summation circuit 105, phase interpolator (PI) control circuit 106, phase interpolator (PI) circuit 107, bang-bang phase detector (BBPD) circuit 108, digital filter circuit 109, and phase-locked loop (PLL) circuit 110.

CDR circuit 100 includes 3 feedback loop circuits. The first feedback loop circuit includes BBPD circuit 101, digital filter circuit 102, summation circuit 105, PI control circuit 106, PI circuit 107, and the conductors that couple these circuits together as shown in FIG. 1. The second feedback loop circuit in CDR circuit 100 includes all of the circuits in the first feedback loop circuit, PPM detector circuit 103, PPM decoder circuit 104, and the conductors that couple these circuits together as shown in FIG. 1. The third feedback loop circuit in CDR circuit 100 includes BBPD circuit 108, digital filter circuit 109, PI control circuit 106, and PI circuit 107 and the conductors that couple these circuits together as shown in FIG. 1.

A transmitter circuit in a first integrated circuit generates a data signal DATA according to a spread spectrum technique. The DATA signal is provided to a receiver circuit in a second integrated circuit through one or more transmission lines. The data signal DATA is provided to inputs of bang-bang phase detector circuits 101 and 108 as shown in FIG. 1. The input data signal DATA may be single-ended or differential.

Phase interpolator (PI) circuit 107 generates 8 periodic clock signals CLK0, CLK45, CLK90, CLK135, CLK180, CLK225, CLK270, and CLK315 in response to 8 clock signals PCLK[7:0] generated by phase-locked loop (PLL) circuit 110. Clock signals CLK0, CLK45, CLK90, CLK135, CLK180, CLK225, CLK270, and CLK315 are referred to herein as the recovered clock signals. Clock signals PCLK[7:0] have the same frequencies. The recovered clock signals CLK0, CLK45, CLK90, CLK135, CLK180, CLK225, CLK270, and CLK315 generated by PI circuit 107 have relative phase offsets of 0°, 45°, 90°, 135°, 180°, 225°, 270°, and 315°, respectively. CDR circuit 100 varies the phases of recovered clock signals CLK0, CLK45, CLK90, CLK135, CLK180, CLK225, CLK270, and CLK315 in response to variations in the data rate of the DATA signal using spread-spectrum clocking in order to track changes in the data rate of the DATA signal.

Clock signals CLK0, CLK90, CLK180, and CLK270 are provided to inputs of bang-bang phase detector circuit 101. Bang-bang phase detector (BBPD) circuit 101 compares transitions in the data signal DATA to the phases of the 4 clock signals CLK0, CLK90, CLK180, and CLK270 to generate an Early/Late signal. Clock signals CLK0, CLK90, CLK180, and CLK270 are offset in phase at 90° phase intervals. The Early/Late signal is indicative of the phase differences between the DATA signal and clock signals CLK0, CLK90, CLK180, and CLK270.

In a half-rate embodiment of CDR circuit 100, a unit interval (UI) in the DATA signal is one-half of a period of each of the recovered clock signals. One unit interval equals one bit period in the DATA signal. In a half-rate embodiment, BBPD 101 generates a logic high state in the Early/Late signal in response to transitions in the DATA signal occurring less than one-half a unit interval earlier in time than the rising edges in the CLK90 and CLK270 clock signals. BBPD 101 generates a logic low state in the Early/Late signal in response to transitions in the DATA signal occurring less than one-half a unit interval later in time than the rising edges in the CLK90 and CLK270 clock signals.

The Early/Late signal is provided to an input of digital filter circuit 102. Digital filter circuit 102 filters the Early/Late signal to generate two digital output signals UP1 and DN1. Digital filter circuit 102 filters components of the Early/Late signal that are caused by random jitter. Digital filter circuit 102 generates a logic high state in the UP1 signal and a logic low state in the DN1 signal when digital filter circuit 102 samples more logic high states than logic low states in the Early/Late signal during a pre-determined number of unit intervals of the DATA signal. Digital filter circuit 102 generates a logic high state in the DN1 signal and a logic low state in the UP1 signal when digital filter circuit 102 samples more logic low states than logic high states in the Early/Late signal during a pre-determined number of unit intervals of the DATA signal.

The UP1 and DN1 signals are provided to inputs of PPM detector circuit 103 and summation circuit 105. PPM detector circuit 103 generates signals UP2I, DN2I, P1, P2, P3, and P4 based on the UP1 and DN1 signals. Signals P1, P2, P3, and P4 are also collectively referred to herein as signals P[4:1]. PPM decoder circuit 104 generates signals UP2O0, UP2O1, DN2O0, and DN2O1 based on signals UP2I, DN2I, P1, P2, P3, and P4. Summation circuit 105 sums signals UP1, DN1, UP2O0, UP2O1, DN2O0, and DN2O1 to generate signals A0, A1, B0, B1, and SIGN.

Signals A0, A1, B0, B1, and SIGN are provided to inputs of phase interpolator control circuit 106. Phase interpolator (PI) control circuit 106 generates phase interpolator control (PIC) signals based on signals A0, A1, B0, B1, and SIGN. Signals PIC are provided to inputs of phase interpolator (PI) circuit 107. PI circuit 107 sets the phases of the recovered clock signals CLK0, CLK45, CLK90, CLK135, CLK180, CLK225, CLK270, and CLK315 based on the logic states of the PIC signals generated by PI control circuit 106. The PIC signals are a set of digital control signals that encode the phase setting for phase interpolator (PI) circuit 107. PI circuit 107 adjusts the phases of the recovered clock signals CLK0, CLK45, CLK90, CLK135, CLK180, CLK225, CLK270, and CLK315 in response to changes in the logic states of the PIC signals.

Phase interpolator circuit 107 may include one or multiple component phase interpolator circuits that each generate one or more of the recovered clock signals. For example, phase interpolator circuit 107 can include 1, 2, 4, or 8 component phase interpolator circuits.

Clock signals CLK45, CLK135, CLK225, and CLK315 are provided to inputs of bang-bang phase detector (BBPD) circuit 108. BBPD circuit 108 compares transitions in the DATA signal to the phases of the 4 clock signals CLK45, CLK135, CLK225, and CLK315 to generate digital phase comparison signal DZ. Clock signals CLK45, CLK135, CLK225, and CLK315 are offset in phase at 90° phase intervals. The DZ phase comparison signal is indicative of the phase differences between the DATA signal and clock signals CLK45, CLK135, CLK225, and CLK315. The DZ signal is provided to digital filter circuit 109. Digital filter circuit 109 filters the DZ signal to generate a Gain signal. As an example, digital filter circuit 109 may be an up counter circuit. The Gain signal is provided to an input of PI control circuit 106. PI control circuit 106 sets the logic states of the PIC signals based in part on the Gain signal when the third feedback loop circuit in CDR circuit 100 is functioning. Further details of the operation of the third feedback loop circuit in CDR circuit 100 are described in commonly-assigned U.S. patent application Ser. No. 12/642,738, filed Dec. 18, 2009 by Teng Chow Ooi et al., which is incorporated by reference herein in its entirety.

The second feedback loop circuit in CDR circuit 100 adjusts the phases of the recovered clock signals using spread-spectrum clocking (SSC) to track changes in the data rate of the DATA signal caused by a spread-spectrum technique. The second feedback loop circuit in CDR circuit 100 performs more filtering and sampling than the first feedback loop circuit. As a result, the second feedback loop circuit causes the phases of the recovered clock signals to be more accurate relative to the DATA signal. The second feedback loop circuit also causes the phases of the recovered clock signals to adjust more quickly to changes in the data rate of the DATA signal.

When the second feedback loop circuit is on and performing spread-spectrum clocking (SSC), the phase differences between the DATA signal and the recovered clock signals are large enough to cause CDR circuit 100 to be out of the deadzone. When CDR circuit 100 turns on the second feedback loop circuit, CDR circuit 100 turns off the third feedback loop circuit. The second and third feedback loop circuits do not function concurrently.

The second feedback loop circuit operates in the harmonic frequencies of the first feedback loop circuit to ease the convergence of the recovered clock signals to phases that are based on the transitions in the DATA signal. The first and the second feedback loop circuits adjust the phases of the recovered clock signals to cause the phases of the recovered clock signals to have predefined relationships relative to transitions in the DATA signal. In a half-rate embodiment of CDR circuit 100, each period in the recovered clock signals is set to equal two times the duration of each unit interval in the DATA signal.

The second feedback loop circuit compensates most of the phase difference between the recovered clock signals and the DATA signal. The first feedback loop circuit quickly compensates any overcompensated or undercompensated changes in the recovered clock signals that are caused by the second feedback loop circuit to minimize accumulated jitter.

In order to ensure that the frequency tracking of the DATA signal that the second feedback loop circuit performs does not interfere with the phase tracking of the DATA signal performed by the first feedback loop circuit, the latency of the first feedback loop circuit is set to be much smaller than the latency of the second feedback loop circuit.

The frequency tracking capability of CDR circuit 100 can be measured in terms of parts per million (PPM) of a unit interval of the DATA signal. CDR circuit 100 changes the phases of the recovered clock signals to match a change in the data rate of the DATA signal. The changes in the phases of the recovered clock signals are measured in PPM. For example, CDR circuit 100 may shift the phase of each of the recovered clock signals by 500 PPM, which equals (500×UI)/1,000,000, where a UI equals the unit interval of the DATA signal.

A CDR circuit that generates recovered clock signals using spread-spectrum clocking according to the SATA standard should be able to generate phase shifts in the recovered clock signals that are as large as 5000 PPM to track changes in the data rate of the data signal. Previously known CDR circuits cannot generate phase shifts of 5000 PPM. CDR circuit 100 in FIG. 1 can, for example, generate phase shifts in the recovered clock signals in a range between 0 PPM and 5500 PPM to track changes in the data rate of the DATA signal.

Figure 2:
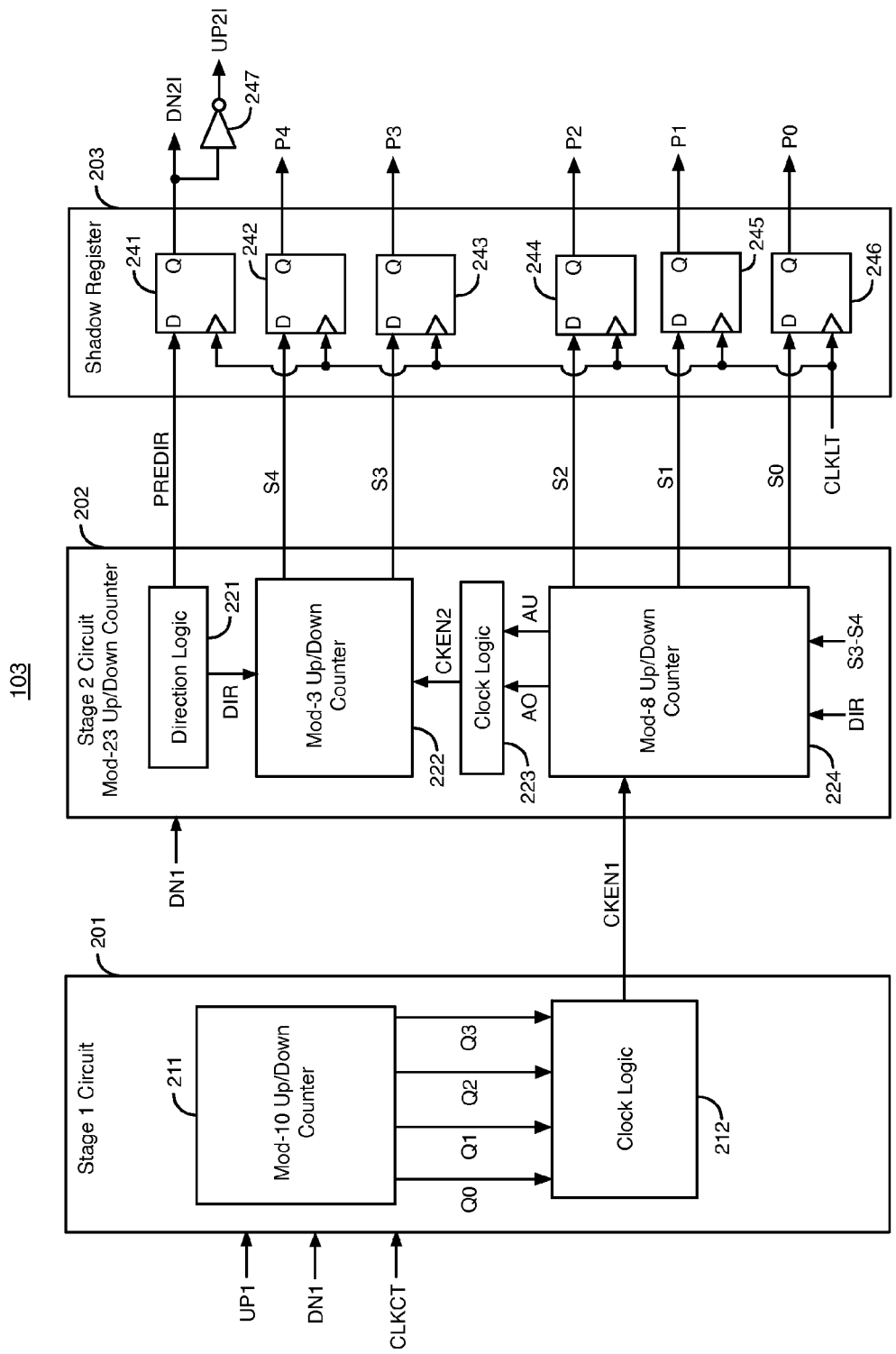
FIG. 2 is a more detailed diagram of the PPM detector circuit in the clock data recovery (CDR) circuit of FIG. 1, according to an embodiment of the present invention.

FIG. 2 is a more detailed diagram of the PPM detector circuit 103 in clock data recovery (CDR) circuit 100, according to an embodiment of the present invention. As shown in FIG. 2, PPM detector circuit 103 includes stage 1 circuit 201, stage 2 circuit 202, and shadow register circuit 203. PPM detector circuit 103 generates a net count based on input signals UP1 and DN1 to generate output signals P4, P3, P2, P1, P0, UP2I, and DN2I that indicate the current difference in PPM between the phases of the recovered clock signals and the data rate of the DATA signal. The latency of the second feedback loop circuit is determined by clock signal CLKLT. According to an embodiment, the latency of the second feedback loop circuit equals 1200×UI, where UI is one unit interval of the DATA signal. In this embodiment, clock signal CLKLT has a period equal to 1200×UI.

Stage 1 circuit 201 includes a mod-10 up/down counter circuit 211 and clock logic circuit 212. Counter circuit 211 increments or decrements a count value based on the UP1 and DN1 signals and a clock signal CLKCT. The phase shift in PPM that mod-10 up/down counter circuit 211 can generate in the phases of the recovered clock signals in each phase step P is shown in equation (1) below.

$$PPM = (C \times 1{,}000{,}000)/(P \times L) \qquad (1)$$

In equation (1), C equals the net count of the UP1 and DN1 signals generated by counter circuit 211, P equals the phase step, and L equals the latency of the second feedback loop circuit. The phase step P equals the number of unique phase shifts that PI circuit 107 can generate in each of the recovered clock signals within one unit interval (UI) of the DATA signal. According to one example of a half-rate embodiment, P equals a fixed value of 32, L equals a fixed value of 1200 UI, and PPM is set to 250. Using these values in equation (1), C equals about 10, and mod-10 up/down counter circuit 211 is selected to count up to a maximum count value of 10.

Figure 3:
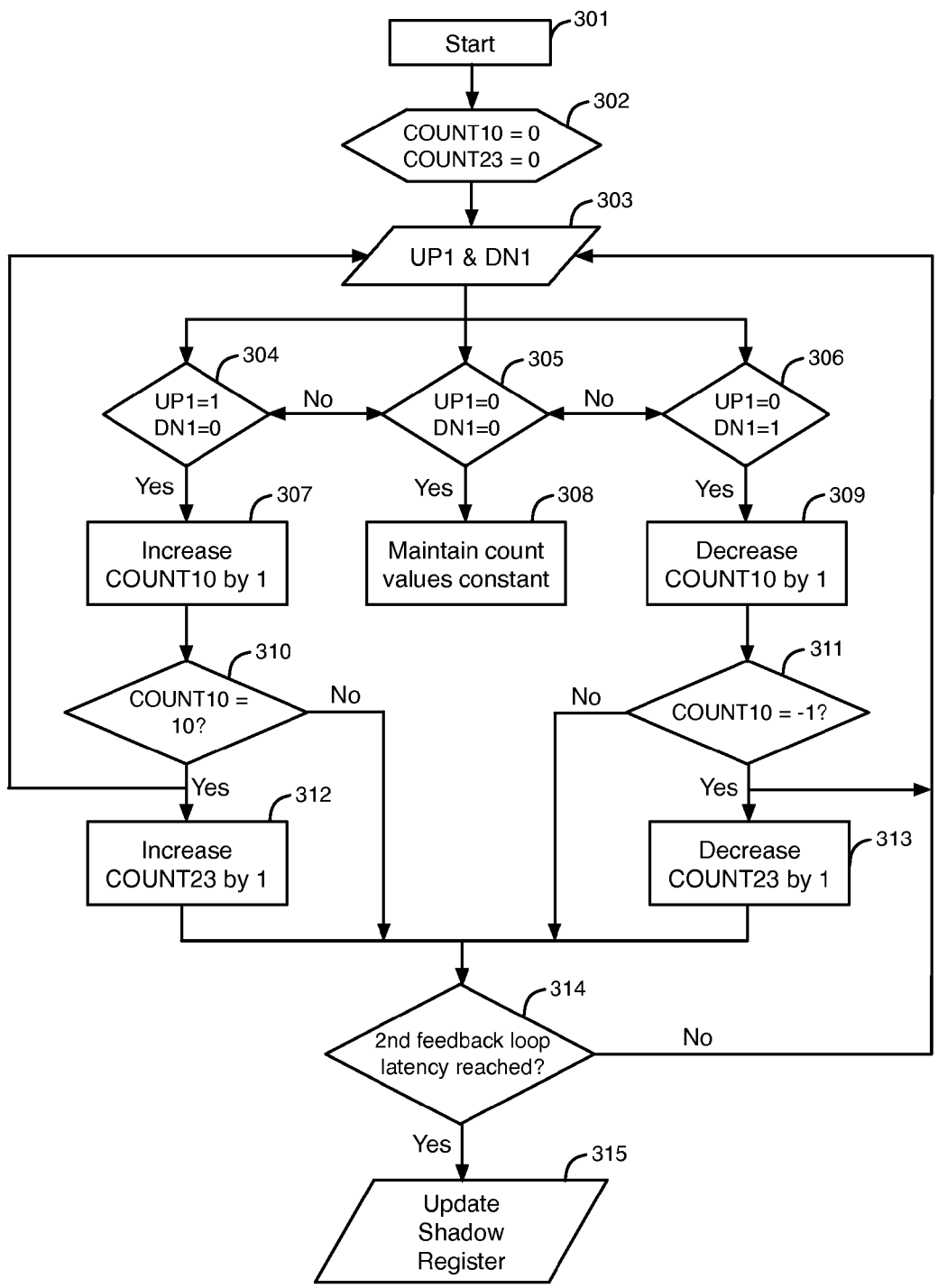
FIG. 3 is an exemplary flow chart that illustrates the operation of the PPM detector circuit of FIG. 2, according to an embodiment of the present invention.

FIG. 3 is a flow chart that illustrates the operation of PPM detector circuit 103, according to an embodiment of the present invention. Mod-10 up/down counter circuit 211 in PPM detector circuit 103 generates a count value COUNT10. Stage 2 circuit 202 in PPM detector circuit 103 functions as a mod-23 up/down counter circuit. The mod-23 up/down counter circuit generates a count value COUNT23.

PPM detector circuit 103 begins operation (e.g., after power up) at start operation 301. Subsequently, in operation 302, mod-10 up/down counter circuit 211 sets its count value COUNT10 to zero, and the mod 23 up/down counter circuit in stage 2 circuit 202 sets its count value COUNT23 to zero. In operation 303, mod-10 up/down counter circuit 211 checks the digital values of the UP1 and DN1 signals received from digital filter circuit 102.

In the context of digital signals, a 1 represents a logic high state, and a 0 represents a logic low state. If the UP1 signal is in a logic high state, and the DN1 signal is in a logic low state at decision operation 304, then mod-10 up/down counter circuit 211 increases its count value COUNT10 by 1 at operation 307. Thus, the new value of COUNT10 equals the old value of COUNT10 plus 1. At decision operation 310, stage 1 circuit 201 determines if count value COUNT10 equals 10. If count value COUNT10 does not equal 10 at decision operation 310, then PPM detector circuit 103 determines if the latency of the second feedback loop circuit (e.g., 1200 UI) has been reached at decision operation 314. If the latency of the second feedback loop circuit has not been reached at operation 314, mod-10 up/down counter circuit 211 checks the digital values of the UP1 and DN1 signals again at operation 303.

If count value COUNT10 equals 10 at decision operation 310, then the mod-23 up/down counter circuit in stage 2 circuit 202 increases the count value COUNT23 by 1 in operation 312. Next, PPM detector circuit 103 determines if the latency of the second feedback loop circuit has been reached at decision operation 314. If the latency of the second feedback loop circuit has not been reached at operation 314, mod-10 up/down counter circuit 211 checks the digital values of the UP1 and DN1 signals again at operation 303.

If both the UP1 and DN1 signals are in logic low states at decision operation 305, then mod-10 up/down counter circuit 211 and the mod-23 up/down counter circuit maintain count values COUNT10 and COUNT23 constant, respectively, in operation 308.

If the UP1 signal is in a logic low state, and the DN1 signal is in a logic high state at decision operation 306, then mod-10 up/down counter circuit 211 decreases its count value COUNT10 by 1 at operation 309. Thus, the new value of COUNT10 equals the old value of COUNT10 minus 1. At decision operation 311, stage 1 circuit 201 determines if count value COUNT10 equals −1. If count value COUNT10 does not equal −1 at decision operation 311, then PPM detector circuit 103 determines if the latency of the second feedback loop circuit has been reached at decision operation 314. If the latency of the second feedback loop circuit has not been reached at operation 314, mod-10 up/down counter circuit 211 returns to operation 303.

If count value COUNT10 equals −1 at decision operation 311, then the mod-23 up/down counter circuit in stage 2 circuit 202 decreases the count value COUNT23 by 1 in operation 313. Next, PPM detector circuit 103 determines if the latency of the second feedback loop circuit has been reached at decision operation 314. If the latency of the second feedback loop circuit has not been reached at operation 314, mod-10 up/down counter circuit 211 returns to operation 303. Mod-10 up/down counter circuit 211 and the mod-23 up/down counter circuit in stage 2 circuit 202 do not need to be periodically reset, because these counter circuits store the current PPM state as count values COUNT10 and COUNT23.

When the latency of the second feedback loop circuit has been reached at operation 314, PPM detector circuit 103 updates shadow register circuit 203 at operation 315 with updated values of signals generated by the mod-23 up/down counter circuit, as described in detail below.

Figure 4:
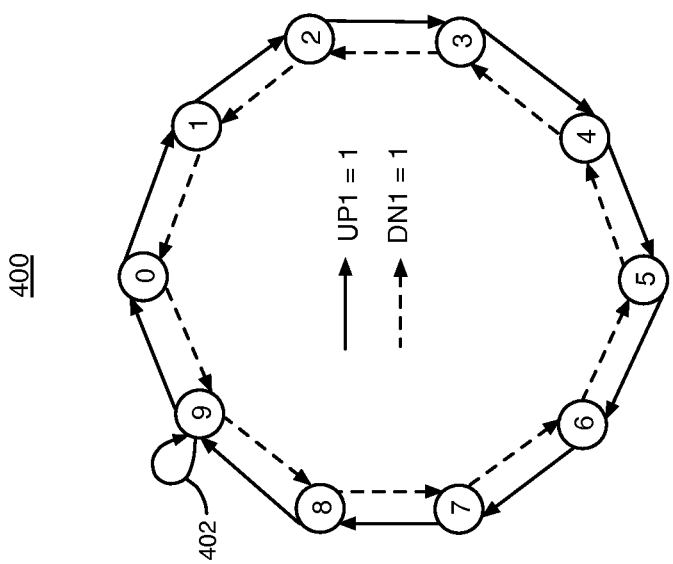
FIG. 4 illustrates a diagram of a finite state machine for the mod-10 up/down counter circuit shown in FIG. 2, according to an embodiment of the present invention.

FIG. 4 illustrates a diagram of a finite state machine 400 for mod-10 up/down counter circuit 211, according to an embodiment of the present invention. As shown in FIG. 4, the finite state machine 400 for mod-10 up/down counter circuit 211 has 10 states numbered 0 through 9. The current state of finite state machine 400 is one of the ten states 0-9 shown in FIG. 4. Finite state machine 400 is in only one of states 0-9 at any time. Mod-10 up/down counter circuit 211 updates the current state of finite state machine 400 at each rising edge of clock signal CLKCT based on the logic states of the UP1 and DN1 signals. The period of clock signal CLKCT equals the correction rate of the first feedback loop circuit in unit intervals of the DATA signal. Examples of the period of clock signal CLKCT are described with respect to Tables 2, 5 and 6 below.

State machine 400 in mod-10 up/down counter circuit 211 begins operation in state 0 with a count value COUNT10 of 0. In response to each rising edge of clock signal CLKCT, mod-10 up/down counter circuit 211 samples the values of the UP1 and DN1 signals received from digital filter 102. If the sampled value of the UP1 signal is a logic high state (1) and the sampled value of the DN1 signal is a logic low state (0) at a rising edge of CLKCT, the finite state machine 400 transitions to the next higher state as shown by the solid straight arrows in FIG. 4 and increases count value COUNT10 by one. If the sampled value of the UP1 signal is a logic low state (0) and the sampled value of the DN1 signal is a logic high state (1) at a rising edge of CLKCT, the finite state machine 400 transitions to the next lower state as shown by the dashed straight arrows in FIG. 4 and decreases count value COUNT10 by one.

For example, if the sampled value of the UP1 signal is a logic high state and the sampled value of the DN1 signal is a logic low state during 6 consecutive rising edges of clock signal CLKCT, state machine 400 transitions to state 6, and the count value COUNT10 increases from 0 to 6. If the sampled value of the UP1 signal is a logic low state and the sampled value of the DN1 signal is a logic high state during the next 4 consecutive rising edges of clock signal CLKCT, state machine 400 transitions to state 2, and the count value COUNT10 decreases from 6 to 2.

Mod-10 up/down counter 211 generates 4 digital count signals Q3, Q2, Q1, and Q0. The binary value of count signals Q3, Q2, Q1, and Q0 equals the numerical value of the current state of finite state machine 400 (i.e., one of states 0-9 in FIG. 4). Q3 is the most significant bit of the current state, Q2 is the second most significant bit of the current state, Q1 is the second least significant bit of the current state, and Q0 is the least significant bit of the current state.

Figure 5:
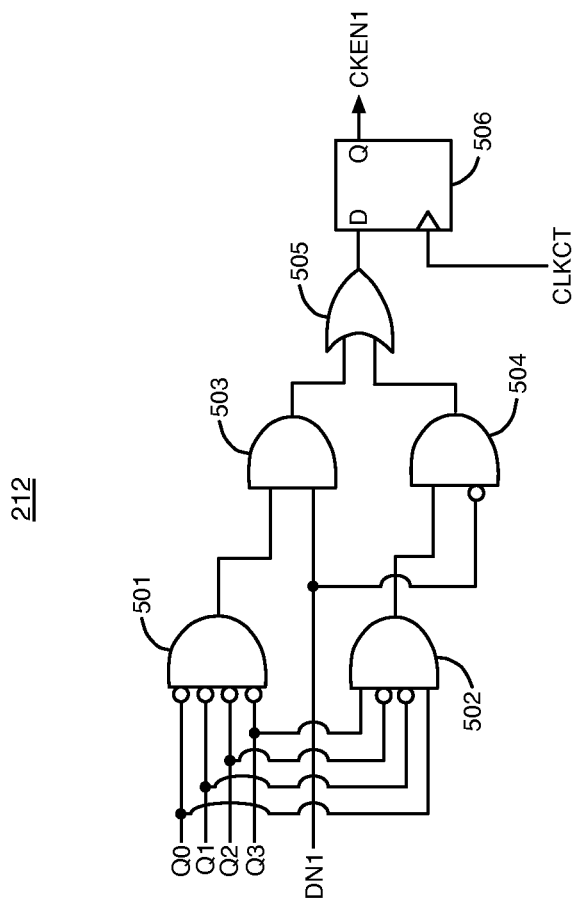
FIG. 5 illustrates an example of the circuit structure of the clock logic circuit in the stage 1 circuit of FIG. 2, according to an embodiment of the present invention.

As shown in FIG. 2, signals Q0, Q1, Q2, and Q3 are provided from mod-10 up/down counter circuit 211 to clock logic circuit 212. FIG. 5 illustrates an example of the circuit structure of clock logic circuit 212, according to an embodiment of the present invention. As shown in FIG. 5, clock logic circuit 212 includes AND logic gates 501-504, OR logic gate 505, and D flip-flop circuit 506. The small circles in FIG. 5 at all 4 inputs of AND gate 501, at 2 inputs of AND gate 502, and at one input of AND gate 504 represent inverter circuits.

Signals Q0-Q3 are provided to inverting inputs of AND gate 501. Signals Q1-Q2 are provided to inverting inputs of AND gate 502. Signals Q0 and Q3 are provided to non-inverting inputs of AND gate 502. The DN1 signal is provided to a non-inverting input of AND gate 503 and to an inverting input of AND gate 504. The output signal of AND gate 501 is provided to a non-inverting input of AND gate 503. The output signal of AND gate 502 is provided to a non-inverting input of AND gate 504. The output signals of AND gates 503-504 are provided to non-inverting inputs of OR gate 505.

The output signal of OR gate 505 is provided to the D input of flip-flop circuit 506. Clock signal CLKCT is provided to the clock input of flip-flop circuit 506. Flip-flop circuit 506 generates a clock enable signal CKEN1 at its Q output. Flip-flop circuit 506 stores the logic state of the output signal of OR gate 505 at its Q output in clock enable signal CKEN1 in response to each rising edge in clock signal CLKCT.

When finite state machine 400 is in state 9, signals Q3, Q2, Q1, and Q0 have a binary value of 1001, causing the output signal of AND gate 502 to be in a logic high state. If the DN1 signal is in a logic low state, the output signals of AND gate 504 and OR gate 505 are both in logic high states. If the DN1 signal is still in a logic low state at the next rising edge of clock signal CLKCT, flip-flop circuit 506 generates a rising edge in clock enable signal CKEN1, which represents a count value of 10 in COUNT10. The current state of finite state machine 400 transitions from state 9 to state 0 if signal UP1 is in a logic high state and signal DN1 is in a logic low state at the next rising edge of clock signal CLKCT that occurs after finite state machine 400 enters state 9. If the UP1 and DN1 signals are both in logic low states at the next rising edge of clock signal CLKCT, then the current state of finite state machine 400 remains at state 9. Flip-flop circuit 506 generates a subsequent falling edge in clock enable signal CKEN1 at the next rising edge of clock signal CLKCT occurring after finite state machine 400 exits state 9.

When finite state machine 400 is in state 0, signals Q3, Q2, Q1, and Q0 have a binary value of 0000, causing the output signal of AND gate 501 to be in a logic high state. If the DN1 signal is in a logic high state, the output signals of AND gate 503 and OR gate 505 are both in logic high states. If the DN1 signal is still in a logic high state at the next rising edge of clock signal CLKCT, flip-flop circuit 506 generates a rising edge in clock enable signal CKEN1, which represents a count value of −1 in COUNT10. The current state of finite state machine 400 transitions from state 0 to state 9 if signal UP1 is in a logic low state and signal DN1 is in a logic high state at the next rising edge of clock signal CLKCT occurring after finite state machine 400 enters state 0. If the UP1 and DN1 signals are both in logic low states at the next rising edge of clock signal CLKCT, then the current state of finite state machine 400 remains at state 0. Flip-flop circuit 506 generates a subsequent falling edge in clock enable signal CKEN1 at the next rising edge of clock signal CLKCT occurring after finite state machine 400 exits state 0 or the DN1 signal transitions to a logic low state.

Referring again to FIG. 2, stage 2 circuit 202 includes direction logic circuit 221, mod-3 up/down counter circuit 222, clock logic circuit 223, and mod-8 up/down counter circuit 224. The CKEN1 signal is provided from stage 1 circuit 201 to an input of mod-8 up/down counter circuit 224 in stage 2 circuit 202. Stage 2 circuit 202 also receives the DN1 signal at an input. Stage 2 circuit 202 generates 6 digital output signals PREDIR, S4, S3, S2, S1, and S0.

Figure 6:
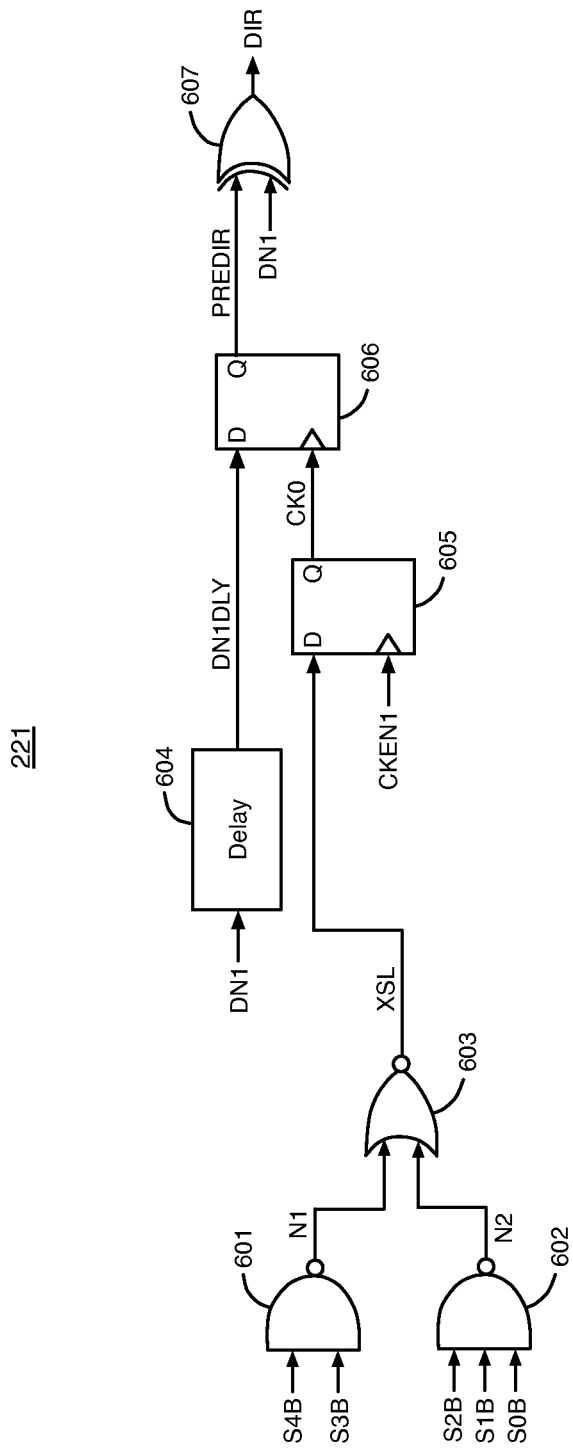
FIG. 6 illustrates an example of the direction logic circuit in the stage 2 circuit of FIG. 2, according to an embodiment of the present invention.

FIG. 6 illustrates an example of direction logic circuit 221, according to an embodiment of the present invention. As shown in FIG. 6, direction logic circuit 221 includes NAND logic gates 601-602, NOR logic gate 603, delay circuit 604, D flip-flops 605-606, and XOR logic gate 607. Inverter circuits (not shown) invert the logic states of output signals S4, S3, S2, S1, and S0 of stage 2 circuit 202 to generate inverted signals S4B, S3B, S2B, S1B, and S0B, respectively.

Inverted signals S4B and S3B are provided to inputs of NAND gate 601. Inverted signals S2B, S1B, and S0B are provided to inputs of NAND gate 602. The output signals N1 and N2 of NAND gates 601-602 are provided to inputs of NOR gate 603. The output signal XSL of NOR gate 603 is provided to the D input of flip-flop circuit 605.

The DN1 signal is provided to an input of delay circuit 604. Delay circuit 604 delays the DN1 signal to generate a delayed signal DN1DLY. Delayed signal DN1DLY is provided to the D input of flip-flop circuit 606. The clock enable signal CKEN1 is provided to the clock input of flip-flop circuit 605. Flip-flop circuit 605 generates signal CK0 at its Q output. Signal CK0 is provided to the clock input of flip-flop circuit 606.

Flip-flop circuit 606 generates signal PREDIR at its Q output. Signal PREDIR is provided to a first input of XOR gate 607. The DN1 signal is provided to a second input of XOR gate 607. XOR gate 607 generates an output signal DIR at its output. As shown in FIG. 2, the signal DIR generated by direction logic circuit 221 is provided to inputs of mod-8 up/down counter circuit 224 and mod-3 up/down counter circuit 222.

When all 5 signals S0-S4 are in logic low states, and all 5 signals S0B-S4B are in logic high states, the output signals N1 and N2 of NAND gates 601-602 are both in logic low states, and the output signal XSL of NOR gate 603 is in a logic high state. Flip-flop circuit 605 generates a rising edge in signal CK0 in response to a rising edge in signal CKEN1 when signal XSL is in a logic high state. Flip-flop circuit 606 updates signal PREDIR with the current logic state of delayed signal DN1DLY in response to the rising edge in signal CK0. Thus, direction logic circuit 221 updates the PREDIR signal with a delayed version of the DN1 signal only when signals S0-S4 are all in logic low states. XOR gate 607 causes output signal DIR to have a logic low state when signals DN1 and PREDIR have the same logic state. XOR gate 607 causes output signal DIR to have a logic high state when signals DN1 and PREDIR have different logic states.

Figure 7:
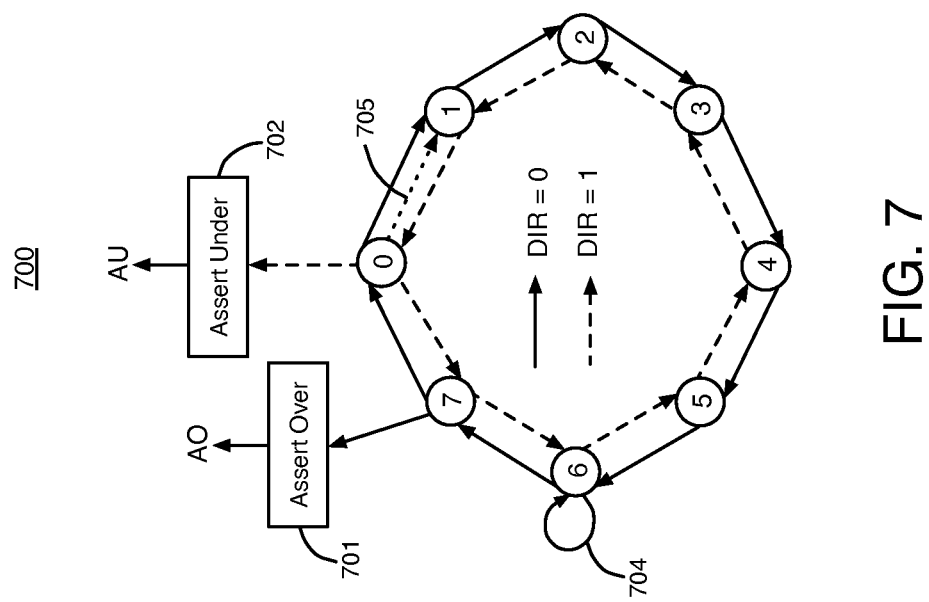
FIG. 7 illustrates a diagram of a finite state machine for the mod-8 up/down counter circuit of FIG. 2, according to an embodiment of the present invention.

FIG. 7 illustrates a diagram of a finite state machine 700 for mod-8 up/down counter circuit 224, according to an embodiment of the present invention. As shown in FIG. 7, the finite state machine 700 for mod-8 up/down counter circuit 224 has 8 states numbered 0 through 7. The current state of finite state machine 700 is one of the 8 states 0-7 shown in FIG. 7. Finite state machine 700 is in only one of states 0-7 at any one time. Mod-8 up/down counter circuit 224 updates the current state of finite state machine 700 at each rising edge of the clock enable signal CKEN1 based on the logic state of the DIR signal.

Finite state machine 700 includes assert over circuit 701 and assert under circuit 702. Assert over circuit 701 generates an output signal AO, and assert under circuit 702 generates an output signal AU. Mod-8 up/down counter circuit 224 generates 5 digital output signals AO, AU, S2, S1, and S0, as shown in FIG. 2. The binary value of signals S2, S1, and S0 equals the numerical value of the current state of finite state machine 700 (i.e., one of states 0-7 in FIG. 7).

State machine 700 begins operation in state 0. In response to each rising edge of clock enable signal CKEN1, mod-8 up/down counter circuit 224 samples the value of the DIR signal received from direction logic circuit 221. If the sampled value of the DIR signal is a logic low state at a rising edge of CKEN1, finite state machine 700 transitions to the next higher state as shown by the solid straight arrows in FIG. 7 and increases the binary value of signals S2, S1, and S0 by one. If the sampled value of the DIR signal is a logic high state at a rising edge of CKEN1, finite state machine 700 transitions to the next lower state as shown by the dashed straight arrows in FIG. 7 and decreases the binary value of signals S2, S1, and S0 by one.

If the current state of finite state machine 700 is 7, and the DIR signal remains in a logic low state on the next rising edge of clock enable signal CKEN1, assert over circuit 701 generates a rising edge in assert over signal AO, and finite state machine 700 transitions to state 0. The binary value of signals S2, S1, and S0 is then set to 0. Subsequently, assert over circuit 701 generates a falling edge in assert over signal AO.

If the current state of finite state machine 700 is 0, and the DIR signal remains in a logic high state on the next rising edge of clock enable signal CKEN1, assert under circuit 702 generates a rising edge in assert under signal AU, and finite state machine 700 transitions to state 7. The binary value of signals S2, S1, and S0 is then set to 7. Subsequently, assert under circuit 702 generates a falling edge in assert under signal AU.

Referring again to FIG. 2, the AO and AU signals are provided to inputs of clock logic circuit 223. Clock logic circuit 223 generates a second clock enable signal CKEN2. Clock enable signal CKEN2 is provided to an input of mod-3 up/down counter circuit 222. Clock logic circuit 223 generates a rising edge in clock enable signal CKEN2 in response to each rising edge that occurs in assert over signal AO. Clock logic circuit 223 also generates a rising edge in clock enable signal CKEN2 in response to each rising edge that occurs in assert under signal AU. Clock logic circuit 223 generates a falling edge in signal CKEN2 a period of time after each rising edge in signal CKEN2.

Figure 8:
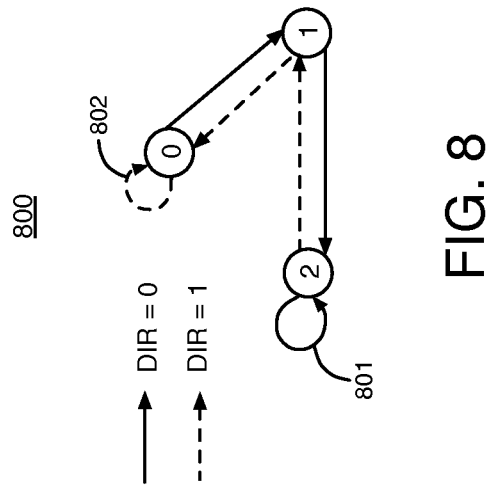
FIG. 8 illustrates a diagram of a finite state machine for the mod-3 up/down counter circuit of FIG. 2, according to an embodiment of the present invention.

FIG. 8 illustrates a diagram of a finite state machine 800 for mod-3 up/down counter circuit 222, according to an embodiment of the present invention. As shown in FIG. 8, finite state machine 800 has 3 states numbered 0, 1, and 2. The current state of finite state machine 800 is one of the three states 0, 1, or 2 shown in FIG. 8. Finite state machine 800 is in only one of states 0, 1, or 2 at any one time. Mod-3 up/down counter circuit 222 updates the current state of finite state machine 800 at each rising edge of the clock enable signal CKEN2 based on the logic state of the DIR signal.

Mod-3 up/down counter circuit 222 generates 2 output signals S4 and S3, as shown in FIG. 2. The binary value of signals S4-S3 equals the numerical value of the current state of finite state machine 800 (i.e., one of states 0-2 in FIG. 8).

State machine 800 begins operation in state 0. In response to each rising edge of clock enable signal CKEN2, mod-3 up/down counter circuit 222 samples the value of the DIR signal received from direction logic circuit 221. If the sampled value of the DIR signal is a logic low state at a rising edge of signal CKEN2, finite state machine 800 transitions to the next higher state as shown by the solid straight arrows in FIG. 8 and increases the binary value of signals S4-S3 by one. If the sampled value of the DIR signal is a logic high state at a rising edge of signal CKEN2, finite state machine 800 transitions to the next lower state as shown by the dashed straight arrows in FIG. 8 and decreases the binary value of signals S4-S3 by one.

If finite state machine 800 is in state 2, finite state machine 800 remains in state 2 in response to each additional logic low state that mod-3 up/down counter circuit 222 samples in the DIR signal, as shown by curved arrow 801. If finite state machine 800 is in state 0, finite state machine 800 remains in state 0 in response to each additional logic high state that mod-3 up/down counter circuit 222 samples in the DIR signal, as shown by curved dashed arrow 802.

In the embodiment described herein, the binary value of signals S4, S3, S2, S1, and S0 equals the count value COUNT23 of the mod-23 up/down counter circuit that is described above with respect to FIG. 3. Signal S4 is the most significant bit of COUNT23, signal S3 is the second most significant bit of COUNT23, signal S2 is the third most significant bit in COUNT23, signal S1 is the second least significant bit in COUNT23, and signal S0 is the least significant bit in COUNT23. Signals S4, S3, S2, S1, and S0 have a minimum binary value of 00000 and a maximum binary value of 10110 (i.e., decimal 22). If finite state machine 400 is in state 9, finite state machine 400 remains in state 9 if mod-10 up/down counter circuit 211 samples a logic low state in signal DN1, and signals S4, S3, S2, S1, and S0 have a binary value of 10110, as shown by arrow 402 in FIG. 4, preventing the binary value of signals S4-S0 from increasing above 10110.

If finite state machine 700 in mod-8 up/down counter circuit 224 is in state 6, finite state machine 700 remains in state 6 if signal DIR is in a logic low state at subsequent rising edges of signal CKEN1, and signals S4 and S3 have logic states of 1 and 0, respectively, as shown by arrow 704 in FIG. 7. State 2 is the highest state in mod-3 up/down counter circuit 222, which corresponds to logic states of 1 and 0 in signals S4 and S3, respectively. Stage 2 circuit 202 prevents the binary value of signals S4, S3, S2, S1, and S0 from exceeding 10110. If finite state machine 700 is in state 0, finite state machine 700 transitions to state 1 (instead of state 7) if signal DIR is in a logic high state at the next rising edge of signal CKEN1, and signals S4 and S3 each have logic low states, as shown by dotted arrow 705 in FIG. 7. Finite state machine 700 only transitions from state 0 to state 7 if signal DIR is in a logic high state at a rising edge of signal CKEN1 and at least one of signals S4 and S3 is in a logic high state.

Referring again to FIG. 2, shadow register circuit 203 includes 6 D flip-flop circuits 241-246. Signal PREDIR is provided to the D input of flip-flop circuit 241. Signals S4, S3, S2, S1, and S0 are provided to the D inputs of flip-flop circuits 242-246, respectively. Clock signal CLKLT is provided to the clock inputs of flip-flop circuits 241-246. Clock signal CLKLT determines the latency of the second feedback loop circuit. In an embodiment, the period of clock signal CLKLT equals 1200 unit intervals of the DATA signal. Flip-flop circuits 241-246 store the logic states of signals PREDIR, S4, S3, S2, S1, and S0 at their Q outputs as signals DN2I, P4, P3, P2, P1, and P0, respectively, in response to each rising edge in clock signal CLKLT. Inverter circuit 247 inverts signal DN2I to generate signal UP2I.

Figure 9:
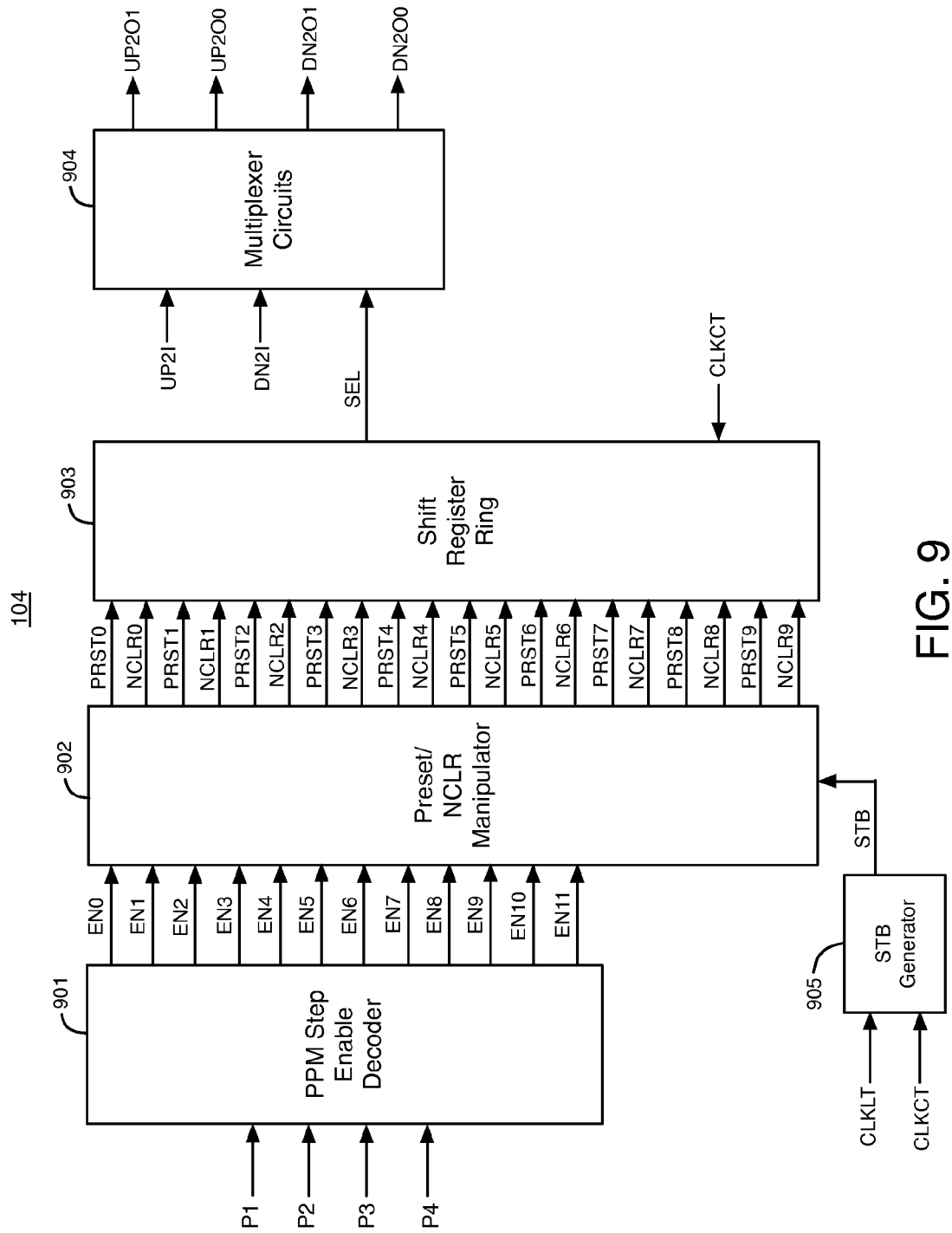
FIG. 9 illustrates an example of the PPM decoder circuit in the clock data recovery (CDR) circuit of FIG. 1, according to an embodiment of the present invention.

FIG. 9 illustrates an example of PPM decoder circuit 104, according to an embodiment of the present invention. PPM decoder circuit 104 includes PPM step enable decoder circuit 901, preset/NCLR manipulator circuit 902, shift register ring circuit 903, multiplexer circuit block 904, and STB signal generator circuit 905 as shown in FIG. 9. Input signals P1, P2, P3, and P4 are provided from outputs of PPM detector circuit 103 to inputs of PPM step enable decoder circuit 901. Input signals UP2I and DN2I are provided from outputs of PPM detector circuit 103 to inputs of multiplexer circuit block 904. PPM decoder circuit 104 decodes signals P1-P4, UP2I, and DN2I to generate output signals UP2O1, UP2O0, DN2O1, and DN2O0.

In the embodiment of FIG. 9, signal P0 is not provided to PPM decoder circuit 104, and PPM detector circuit 103 and PPM decoder circuit 104 cause PI circuit 107 to vary the recovered clock signals by multiples of 500 PPM of a UI in the DATA signal. In another embodiment, PPM decoder circuit 104 decodes all 5 signals P0, P1, P2, P3, and P4 to vary the recovered clock signals by multiples of 250 PPM of a UI in the DATA signal.

Figure 10:
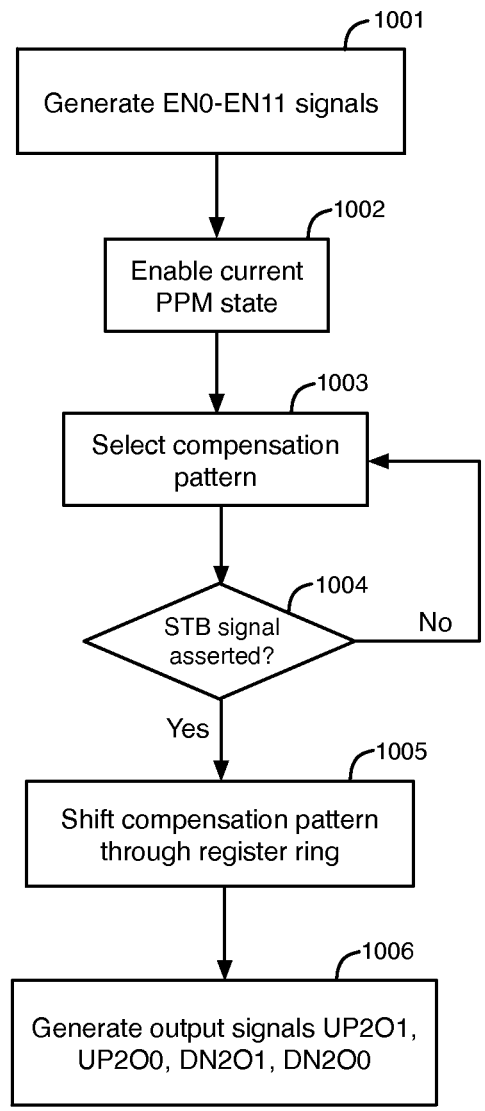
FIG. 10 is an exemplary flow chart that illustrates operations performed by the PPM decoder circuit, according to an embodiment of the present invention.

FIG. 10 is a flow chart that illustrates operations performed by PPM decoder circuit 104, according to an embodiment of the present invention. In operation 1001, PPM step enable decoder circuit 901 decodes the binary value of input signals P4, P3, P2, and P1 to generate 12 decoded enable signals EN0, EN1, EN2, EN3, EN4, EN5, EN6, EN7, EN8, EN9, EN10, and EN11 (i.e., signals EN0-EN11). With respect to the binary value of signals P4, P3, P2, and P1, P4 is the most significant bit of the binary value, P3 is the second most significant bit of the binary value, P2 is the second least significant bit of the binary value, and P1 is the least significant bit of the binary value. In each period of clock signal CLKLT, PPM step enable decoder circuit 901 causes one of signals EN0-EN11 to have a logic high state and the remaining signals EN0-EN11 to have logic low states. The one signal among signals EN0-EN11 that PPM step enable decoder circuit 901 drives to a logic high state corresponds to the binary value of input signals P4, P3, P2, and P1, as shown in Table 1 below.

TABLE 1

| Binary value of P4, P3, P2, P1 | Signal in logic high state among EN0-EN11 |
|---|---|
| 0000 | EN0 |
| 0001 | EN1 |
| 0010 | EN2 |
| 0011 | EN3 |
| 0100 | EN4 |
| 0101 | EN5 |
| 0110 | EN6 |
| 0111 | EN7 |
| 1000 | EN8 |
| 1001 | EN9 |
| 1010 | EN10 |
| 1011 | EN11 |

Enable signals EN0-EN11 are provided to inputs of preset/NCLR manipulator circuit 902. Preset/NCLR manipulator circuit 902 enables the current PPM state in operation 1002 by turning on a set of pass gate transistors and selects a compensation pattern in operation 1003, as described in further detail below with respect to FIGS. 11-12. Preset/NCLR manipulator circuit 902 then determines if an STB signal has been asserted in operation 1004. The STB signal is generated by STB signal generator circuit 905. If the STB signal has not been asserted, then preset/NCLR manipulator circuit 902 returns to operation 1003. If the STB signal has been asserted, shift register ring circuit 903 shifts the compensation pattern through its shift register ring in operation 1005 to generate select signal SEL. Signal SEL is provided to multiplexer circuit block 904. Multiplexer circuit block 904 generates output signals UP2O1, UP2O0, DN2O1, and DN2O0 based on input signals SEL, UP2I, and DN2I at operation 1006.

Figure 11:
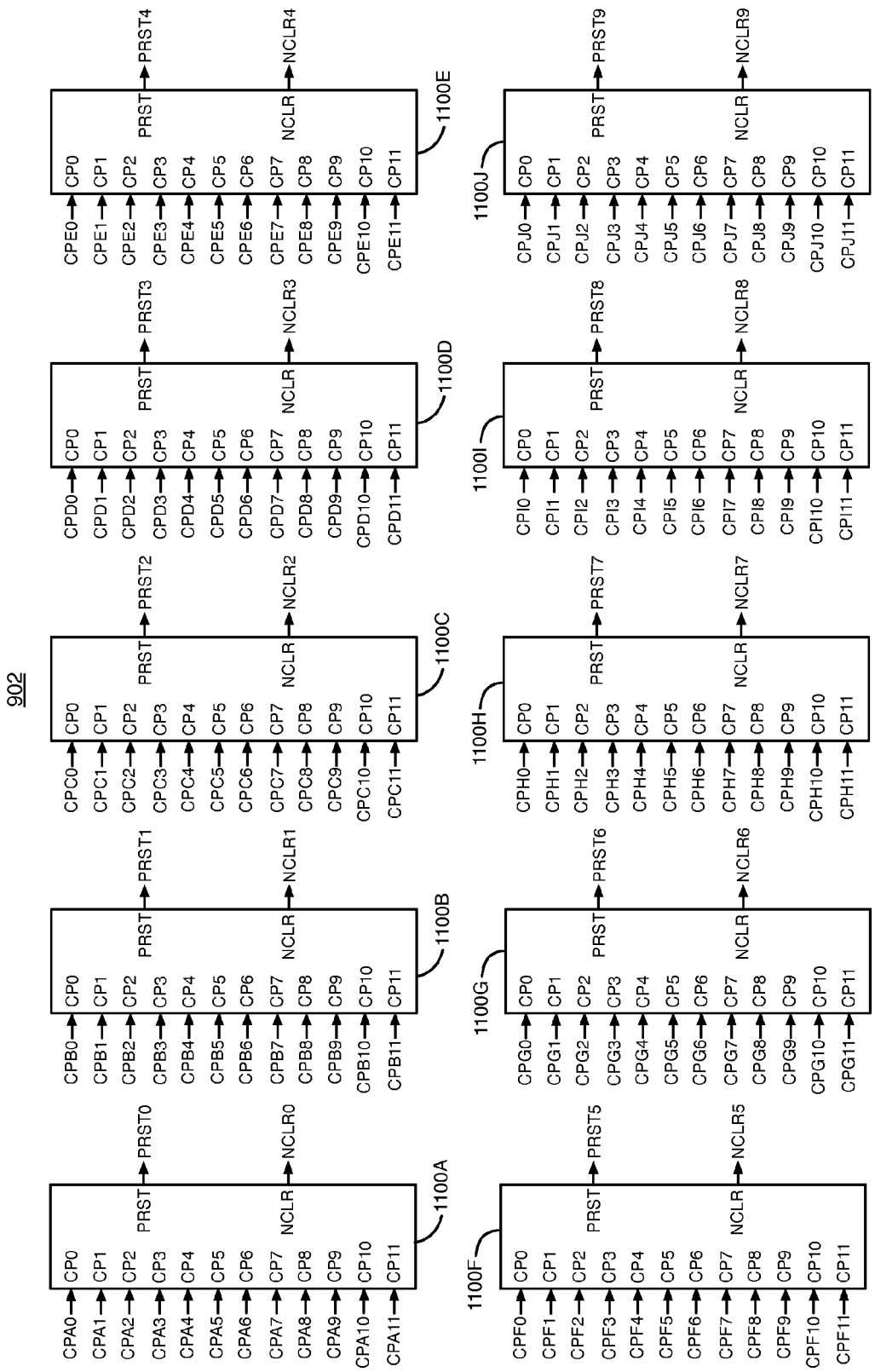
FIG. 11 illustrates a block diagram of the preset/NCLR manipulator circuit of FIG. 9, according to an embodiment of the present invention.
Figure 12:
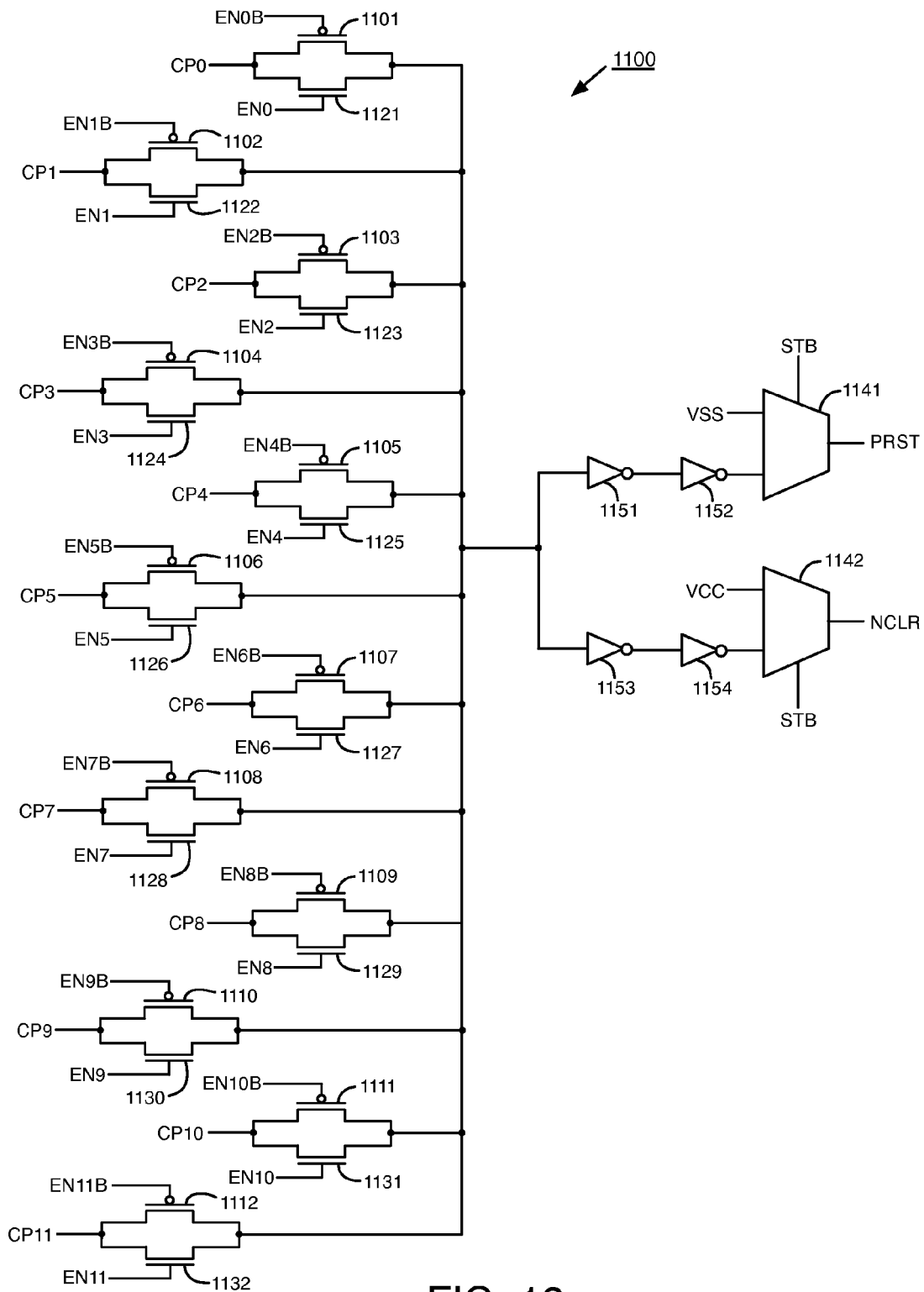
FIG. 12 illustrates an example of a selection circuit, according to an embodiment of the present invention.

FIG. 11 illustrates a block diagram of preset/NCLR manipulator circuit 902, according to an embodiment of the present invention. Preset/NCLR manipulator circuit 902 includes 10 selection circuits 1100A-1100J. FIG. 12 illustrates an example of a selection circuit 1100, according to an embodiment of the present invention. Each of the selection circuits 1100A-1100J in preset/NCLR manipulator circuit 902 has the architecture of selection circuit 1100 shown in FIG. 12.

Selection circuit 1100 as shown in FIG. 12 includes p-channel metal oxide semiconductor field-effect transistors (MOSFETs) 1101-1112, n-channel MOSFETs 1121-1132, inverter circuits 1151-1154, and multiplexer circuits 1141-1142. Signals EN0-EN11 are provided to the gates of n-channel MOSFETs 1121-1132, respectively. 12 inverter circuits (not shown) invert the logic states of enable signals EN0-EN11 to generate inverted signals EN0B-EN11B, respectively. Inverted enable signals EN0B-EN11B are provided to the gates of p-channel MOSFETs 1101-1112, respectively.

12 compensation pattern signals CP0-CP11 are provided to first source/drain terminals of transistors 1101 and 1121, 1102 and 1122, 1103 and 1123, 1104 and 1124, 1105 and 1125, 1106 and 1126, 1107 and 1127, 1108 and 1128, 1109 and 1129, 1110 and 1130, 1111 and 1131, and 1112 and 1132, respectively, as shown in FIG. 12. The compensation pattern signals CP0-CP11 are digital signals. Compensation pattern signals CP0-CP11 determine the corrected phase shifts that the second feedback loop circuit provides to the recovered clock signals, as described in further detail below.

The second source/drain terminals of transistors 1101-1112 and 1121-1132 are coupled to inputs of inverter circuits 1151 and 1153. The outputs of inverter circuits 1151 and 1153 are coupled to inputs of inverter circuits 1152 and 1154, respectively. The outputs of inverter circuits 1152 and 1154 are coupled to first multiplexing inputs of multiplexer circuits 1141 and 1142, respectively. A ground voltage VSS and a supply voltage VCC are provided to second multiplexing inputs of multiplexer circuits 1141 and 1142, respectively. The STB signal is provided to select inputs of multiplexer circuits 1141-1142.

Only one of enable signals EN0-EN11 is in a logic high state, and only one of inverted signals EN0B-EN11B is in a logic low state in each period of clock signal CLKLT. As a result, signals EN0-EN11 and EN0B-EN11B cause only one of n-channel transistors 1101-1112 to be on, only one of p-channel transistors 1121-1132 to be on, and the remaining transistors shown in FIG. 12 to be off. The two transistors that are on provide one of the compensation pattern signals CP0-CP11 to inputs of inverter circuits 1151 and 1153. Inverter circuits 1151-1154 buffer the received compensation pattern signal and provide a buffered compensation pattern signal to the first multiplexing inputs of multiplexer circuits 1141-1142. For example, if enable signal EN5 is in a logic high state, transistors 1106 and 1126 are on, transistors 1101-1105, 1107-1112, 1121-1125, and 1127-1132 are off, and a buffered version of compensation pattern signal CP5 is provided to the first multiplexing inputs of multiplexer circuits 1141-1142.

When the STB signal is in a logic low state, multiplexer circuits 1141-1142 provide voltage signals VSS and VCC to their outputs as signals PRST and NCLR, respectively. When the STB signal is in a logic high state, multiplexer circuits 1141-1142 provide the buffered compensation pattern signal CP0-CP11 selected by transistors 1101-1112 and 1121-1132 to their outputs as signals PRST and NCLR, respectively.

Referring to FIG. 11, each of the selection circuits 1100A-1100J receives a different set of compensation pattern signals. Selection circuits 1100A-1100J receive compensation pattern signals CPA0-CPA11, CPB0-CPB11, CPC0-CPC11, CPD0-CPD11, CPE0-CPE11, CPF0-CPF11, CPG0-CPG11, CPH0-CPH11, CPI0-CPI11, and CPJ0-CPJ11, respectively. The compensation pattern signals CPA0-CPA11, CPB0-CPB11, CPC0-CPC11, CPD0-CPD11, CPE0-CPE11, CPF0-CPF11, CPG0-CPG11, CPH0-CPH11, CPI0-CPI11, and CPJ0-CPJ11 are the signals CP0-CP11, respectively, in FIG. 12 in corresponding ones of the selection circuits 1100A-1100J.

Each of the selection circuits 1100A-1100J generates a different set of output signals. Selection circuits 1100A-1100J generate output signals PRST0 and NCLR0, PRST1 and NCLR1, PRST2 and NCLR2, PRST3 and NCLR3, PRST4 and NCLR4, PRST5 and NCLR5, PRST6 and NCLR6, PRST7 and NCLR7, PRST8 and NCLR8, and PRST9 and NCLR9, respectively. Output signals PRST0 and NCLR0, PRST1 and NCLR1, PRST2 and NCLR2, PRST3 and NCLR3, PRST4 and NCLR4, PRST5 and NCLR5, PRST6 and NCLR6, PRST7 and NCLR7, PRST8 and NCLR8, and PRST9 and NCLR9 generated by selection circuits 1100A-1100J are signals PRST and NCLR, respectively in FIG. 12.

When enable signal EN0 and signal STB are in logic high states, signals PRST0-PRST9 have the same logic states as signals CPA0-CPJ0, respectively, and signals NCLR0-NCLR9 have the same logic states as signals CPA0-CPJ0, respectively. When enable signal EN1 and signal STB are in logic high states, signals PRST0-PRST9 have the same logic states as signals CPA1-CPJ1, respectively, and signals NCLR0-NCLR9 have the same logic states as signals CPA1-CPJ1, respectively. When enable signal EN2 and signal STB are in logic high states, signals PRST0-PRST9 have the same logic states as signals CPA2-CPJ2, respectively, and signals NCLR0-NCLR9 have the same logic states as signals CPA2-

CPJ2, respectively. When enable signal EN3 and signal STB are in logic high states, signals PRST0-PRST9 have the same logic states as signals CPA3-CPJ3, respectively, and signals NCLR0-NCLR9 have the same logic states as signals CPA3-CPJ3, respectively.

When enable signal EN4 and signal STB are in logic high states, signals PRST0-PRST9 have the same logic states as signals CPA4-CPJ4, respectively, and signals NCLR0-NCLR9 have the same logic states as signals CPA4-CPJ4, respectively. When enable signal EN5 and signal STB are in logic high states, signals PRST0-PRST9 have the same logic states as signals CPA5-CPJ5, respectively, and signals NCLR0-NCLR9 have the same logic states as signals CPA5-CPJ5, respectively. When enable signal EN6 and signal STB are in logic high states, signals PRST0-PRST9 have the same logic states as signals CPA6-CPJ6, respectively, and signals NCLR0-NCLR9 have the same logic states as signals CPA6-CPJ6, respectively. When enable signal EN7 and signal STB are in logic high states, signals PRST0-PRST9 have the same logic states as signals CPA7-CPJ7, respectively, and signals NCLR0-NCLR9 have the same logic states as signals CPA7-CPJ7, respectively.

When enable signal EN8 and signal STB are in logic high states, signals PRST0-PRST9 have the same logic states as signals CPA8-CPJ8, respectively, and signals NCLR0-NCLR9 have the same logic states as signals CPA8-CPJ8, respectively. When enable signal EN9 and signal STB are in logic high states, signals PRST0-PRST9 have the same logic states as signals CPA9-CPJ9, respectively, and signals NCLR0-NCLR9 have the same logic states as signals CPA9-CPJ9, respectively. When enable signal EN10 and signal STB are in logic high states, signals PRST0-PRST9 have the same logic states as signals CPA10-CPJ10, respectively, and signals NCLR0-NCLR9 have the same logic states as signals CPA10-CPJ10, respectively. When enable signal EN11 and signal STB are in logic high states, signals PRST0-PRST9 have the same logic states as signals CPA11-CPJ11, respectively, and signals NCLR0-NCLR9 have the same logic states as signals CPA11-CPJ11, respectively.

Figure 13:
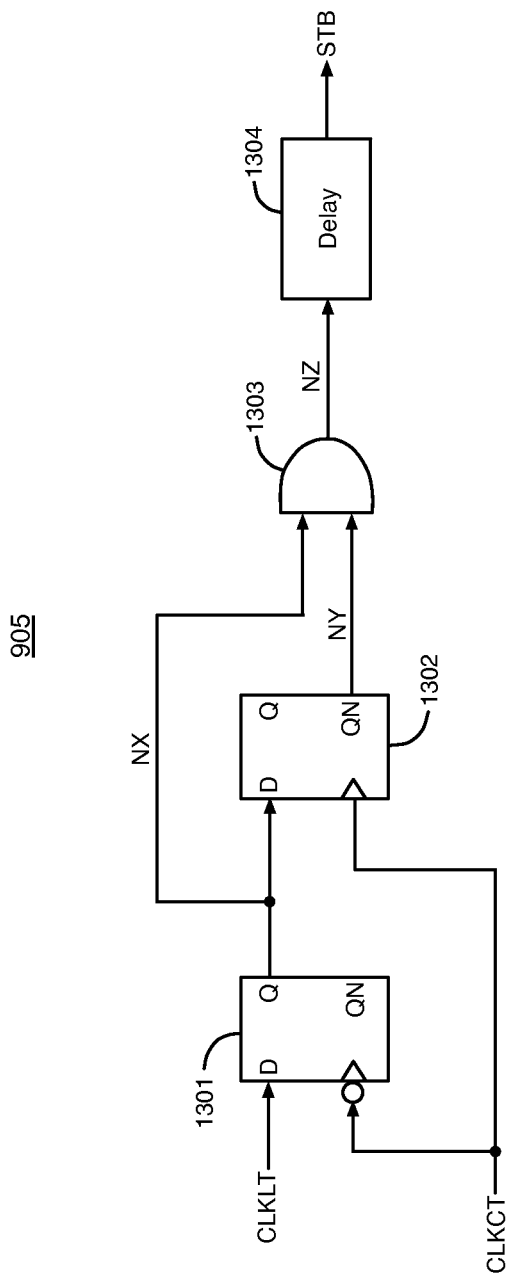
FIG. 13 is a diagram of an STB signal generator circuit, according to an embodiment of the present invention.

FIG. 13 is a diagram of STB signal generator circuit 905, according to an embodiment of the present invention. STB signal generator circuit 905 includes D flip-flop circuits 1301-1302, AND gate circuit 1303, and delay circuit 1304. Clock signal CLKLT is provided to the D input of flip-flop circuit 1301. Clock signal CLKCT is provided to the clock inputs of flip-flop circuits 1301-1302. Flip-flop circuit 1301 stores the logic state of clock signal CLKLT at its Q output as signal NX in response to each falling edge in clock signal CLKCT. Flip-flop circuit 1302 stores the inverted logic state of signal NX at its QN output as signal NY in response to each rising edge in clock signal CLKCT.

The signal NX generated at the Q output of flip-flop circuit 1301 is provided to the D input of flip-flop circuit 1302 and to a first input of AND gate circuit 1303. The signal NY generated at the QN output of flip-flop circuit 1302 is provided to a second input of AND gate circuit 1303. The output signal NZ of AND gate circuit 1303 is provided to an input of delay circuit 1304. Delay circuit 1304 delays signal NZ to generate signal STB. Thus, signal STB is a delayed version of signal NZ.

Figure 14:
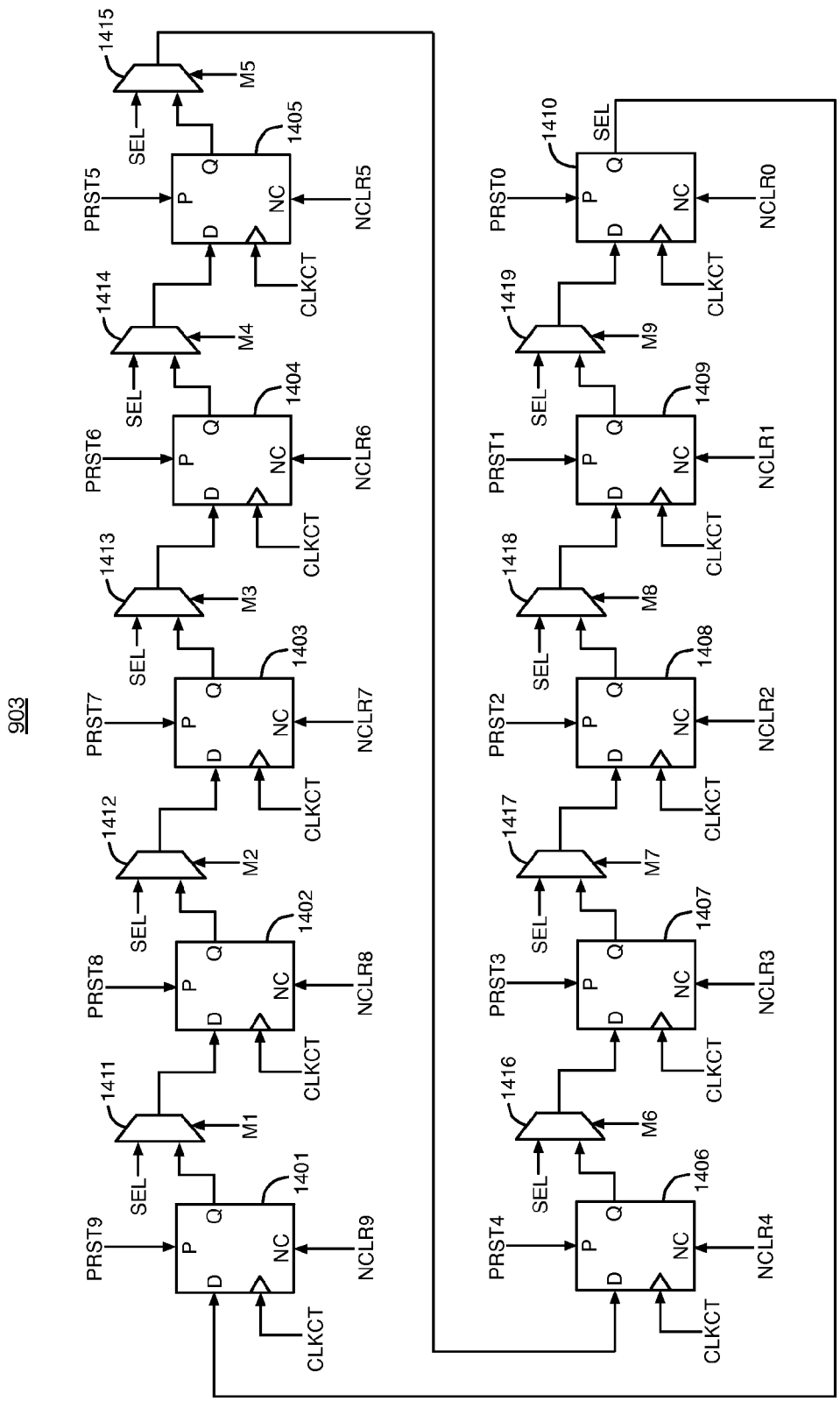
FIG. 14 is a diagram of the shift register ring circuit of FIG. 9, according to an embodiment of the present invention.

FIG. 14 is a diagram of shift register ring circuit 903, according to an embodiment of the present invention. Shift register ring circuit 903 includes D flip-flop circuits 1401-1410 and multiplexer circuits 1411-1419. Flip-flop circuits are storage circuits. Preset signals PRST9, PRST8, PRST7, PRST6, PRST5, PRST4, PRST3, PRST2, PRST1, and PRST0 are provided to the preset (P) inputs of flip-flop circuits 1401-1410, respectively. Not clear signals NCLR9, NCLR8, NCLR7, NCLR6, NCLR5, NCLR4, NCLR3, NCLR2, NCLR1, and NCLR0 are provided to the not clear (NC) inputs of flip-flop circuits 1401-1410, respectively.

Flip-flop circuit 1410 generates a select signal SEL at its Q output. The select signal SEL generated at the Q output of flip-flop circuit 1410 is provided to a first multiplexing input of each of multiplexer circuits 1411-1419 and to the D input of flip-flop circuit 1401. The conductors connecting the Q output of flip-flop circuit 1410 and the first multiplexing inputs of multiplexer circuits 1411-1419 are not shown in FIG. 14 to simplify the drawing. Clock signal CLKCT is provided to the clock inputs of flip-flop circuits 1401-1410.

The Q outputs of flip-flop circuits 1401-1409 are coupled to second multiplexing inputs of multiplexer circuits 1411-1419, respectively. The outputs of multiplexer circuits 1411-1419 are coupled to the D inputs of flip-flop circuits 1402-1410, respectively. Select signals M1-M9 are provided to the select inputs of multiplexer circuits 1411-1419, respectively. The logic states of the select signals M1-M9 determine which of the signals at the multiplexing inputs of multiplexer circuits 1411-1419 are provided to the outputs of multiplexer circuits 1411-1419, respectively.

Figure 15:
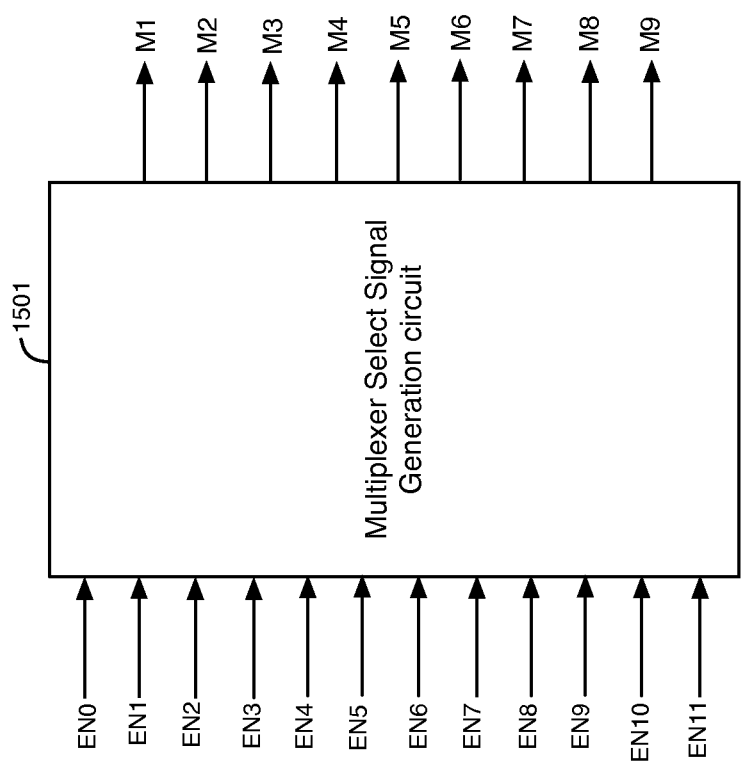
FIG. 15 illustrates an example of a multiplexer select signal generation circuit, according to an embodiment of the present invention.

FIG. 15 illustrates an example of a multiplexer select signal generation circuit 1501, according to an embodiment of the present invention. Multiplexer select signal generation circuit 1501 contains logic circuitry that generates the 9 digital select signals M1-M9 based on the 12 digital enable signals EN0-EN11.

Multiplexer circuits 1411-1419 couple 1, 2, 3, 4, 5, 6, 7, 8, 9, or 10 of the flip-flop circuits 1401-1410 in the shift register ring circuit 903 based on the logic states of the select signals M1-M9. Multiplexer circuits 1411-1419 can decouple one or more of the flip-flop circuits 1401-1409 from shift register ring circuit 903 by providing the select signal SEL from the Q output of flip-flop circuit 1410 to the D input of one of flip-flop circuits 1402-1410, respectively.

Figure 16:
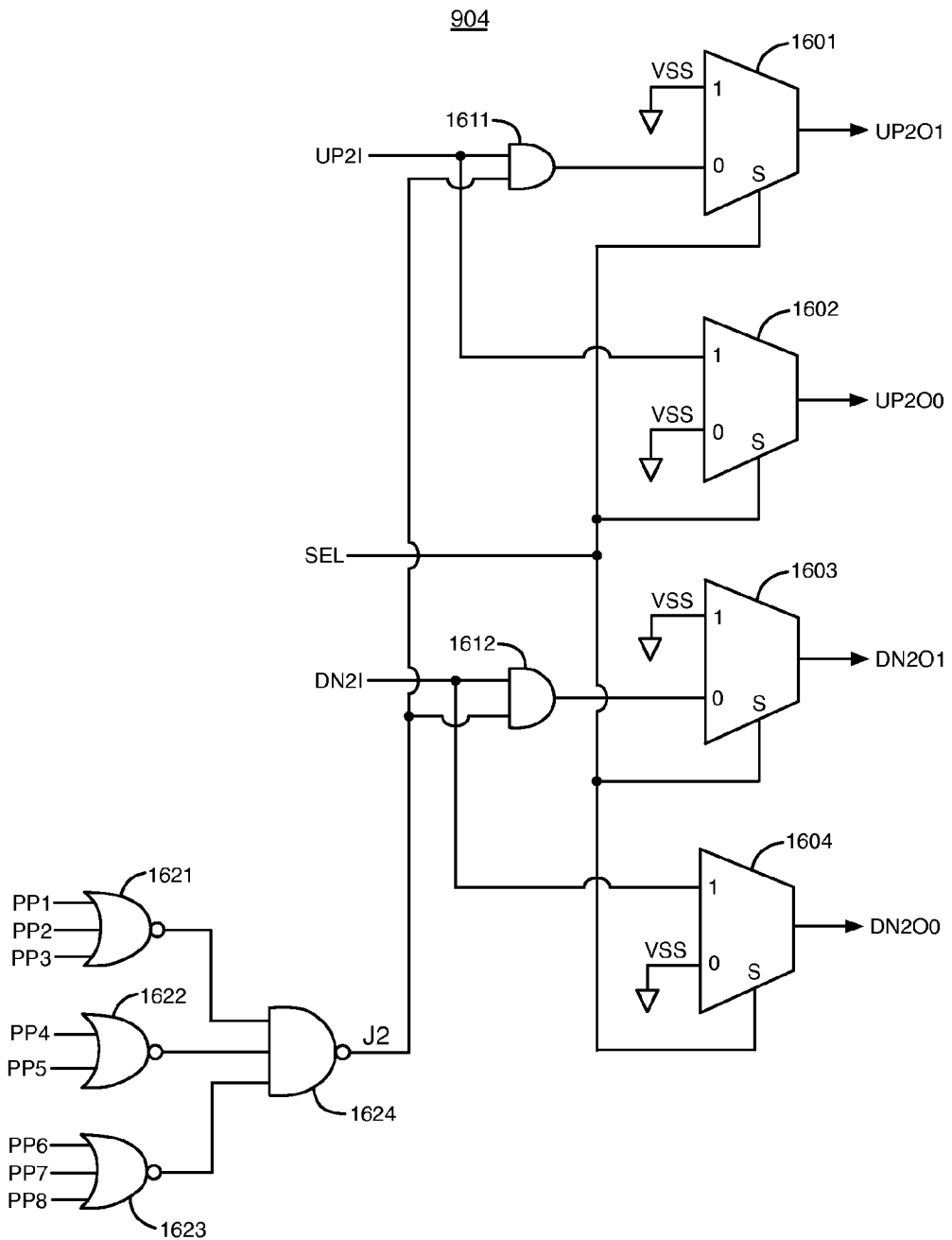
FIG. 16 illustrates an example of a multiplexer circuit block in the PPM decoder circuit of FIG. 1, according to an embodiment of the present invention.

FIG. 16 illustrates an example of multiplexer circuit block 904 in PPM decoder circuit 104, according to an embodiment of the present invention. As shown in FIG. 16, multiplexer circuit block 904 includes multiplexer circuits 1601-1604, AND gate circuits 1611-1612, NOR gate circuits 1621-1623, and NAND gate circuit 1624.

The select signal SEL generated by shift register ring circuit 903 is provided to the select inputs S of each of multiplexer circuits 1601-1604. The ground voltage VSS is provided to the 1, 0, 1, and 0 inputs of multiplexer circuits 1601-1604, respectively. VSS has a fixed constant voltage of 0 volts. The UP2I signal generated by PPM detector circuit 103 is provided to an input of AND gate 1611 and to the 1 input of multiplexer circuit 1602. The output signal of AND gate circuit 1611 is provided to the 0 input of multiplexer circuit 1601. The DN2I signal generated by PPM detector circuit 103 is provided to an input of AND gate 1612 and to the 1 input of multiplexer circuit 1604. The output signal of AND gate circuit 1612 is provided to the 0 input of multiplexer circuit 1603. Multiplexer circuits 1601-1604 generate output signals UP2O1, UP2O0, DN2O1, and DN2O0, respectively, at their outputs.

Control signals PP1-PP3 are provided to inputs of NOR gate 1621. Control signals PP4-PP5 are provided to inputs of NOR gate 1622. Control signals PP6-PP8 are provided to inputs of NOR gate 1623. The output signals of NOR gates 1621-1623 are provided to inputs of NAND gate 1624. The output signal J2 of NAND gate 1624 is provided to inputs of AND gate circuits 1611-1612.

Table 2 below provides example values according to an embodiment of CDR circuit 100. In the embodiment of Table 2, clock signal CLKCT has a period equal to 8 unit intervals of the DATA signal. The first column of Table 2 lists 12 possible corrections (i.e., phase shifts) that CDR circuit 100 can provide to the phases of the recovered clock signals as measured in parts per million (PPM) of a unit interval in the DATA signal. The corrections listed in the first columns of Tables 2, 5 and 6 below can be positive phase shifts that cause the phases of the recovered clock signals to occur earlier in time or negative phase shifts that cause the phases of the recovered clock signals to occur later in time.

The second column of Table 2 lists which of the 12 enable signals EN0-EN11 is in a logic high state to enable CDR circuit 100 to provide the total phase correction listed in the corresponding row of the first column. L1 and L2 in the third column of Table 2 refer to the first and second feedback loop circuits in CDR circuit 100, respectively.

The fourth and seventh columns of Table 2 identify the correction (cor.) added to the phases of the recovered clock signals by the corresponding first and second feedback loop circuits in CDR circuit 100 as measured in parts per million (PPM) of a unit interval of the DATA signal. The corrections listed in each of the fourth and seventh columns for L1 and L2 added together equal the total phase correction provided by CDR circuit 100 listed in the first column.

The fifth and eighth columns of Table 2 identify the correction (cor.) rate provided to the phases of the recovered clock signals by the corresponding first and second feedback loop circuits as measured in unit intervals (UI) of the DATA signal. The correction rate refers to how often the corresponding feedback loop circuit makes changes in the phases of the recovered clock signals. The corrections listed in the fourth and fifth columns of Table 2 are for jumps of plus 1 step or minus 1 step in the phases of the recovered clock signals.

The corrections listed in the seventh and eighth columns of Table 2 are for jumps of 2 steps in the phases of the recovered clock signals. The second feedback loop circuit generates jumps of 2 steps in the phases of the recovered clock signals to reduce the amount of phase shifting that the first feedback loop circuit needs to provide in the recovered clock signals.

The sixth column of Table 2 identifies the averaging in UI of the DATA signal for the correction rates in column 5 that are not multiples of 8. The ninth column of Table 2 identifies the compensation patterns that are provided for signals PRST0-PRST9 and NCLR0-NCLR9, respectively, by selection circuits 1100A-1100J for each of the 12 possible corrections listed in Table 2. In the ninth columns of Tables 2, 5 and 6 below, the notation x refers to a signal that can be in a logic high state or in a logic low state without affecting the operation of CDR circuit 100.

The correction (COR) in parts per million (PPM) that the second feedback loop circuit provides to the phases of the recovered clock signals is shown in equation (2) below. In equation (2), P is the phase step referred to in equation (1), and $L_{VAR}$ is the correction rate of the second feedback loop circuit in UI that varies as shown, for example, in the fifth and eighth columns of Table 2. In an embodiment, P equals a fixed value of 32.

$$COR = 1,000,000/(P \times L_{VAR}) \quad (2)$$

TABLE 2

| PPM Cor. | EN0-EN11 | Loop | Jump Plus/Minus 1 Step | | | Jump 2 Steps | | Compensation patterns |
| | | | PPM Cor. | Cor. Rate (UI) | Averaging | PPM Cor. | Cor. Rate (UI) | |
| --- | --- | --- | --- | --- | --- | --- | --- | --- |
| 0 | EN0 = 1 | L2 | 0 | 0 | | | | CPA0-CPJ0 = 0xxxxxxxxx |
| | | L1 | 0 | 8 | | | | |
| 500 | EN1 = 1 | L2 | 488 | 64 | | | | CPA1-CPJ1 = 00000001xx |
| | | L1 | 12 | 8 | | | | |
| 1000 | EN2 = 1 | L2 | 977 | 32 | | | | CPA2-CPJ2 = 0001xxxxxx |
| | | L1 | 23 | 8 | | | | |
| 1500 | EN3 = 1 | L2 | 1563 | 20 | 16, 24 | | | CPA3-CPJ3 = 01001xxxxx |
| | | L1 | −63 | 8 | | | | |
| 2000 | EN4 = 1 | L2 | 1953 | 16 | | | | CPA4-CPJ4 = 01xxxxxxxx |
| | | L1 | 47 | 8 | | | | |
| 2500 | EN5 = 1 | L2 | 2604 | 12 | 8, 16 | | | CPA5-CPJ5 = 101xxxxxxx |
| | | L1 | −104 | 8 | | | | |
| 3000 | EN6 = 1 | L2 | 3125 | 10 | 8, 8, 8, 16 | | | CPA6-CPJ6 = 11101xxxxx |
| | | L1 | −125 | 8 | | | | |
| 3500 | EN7 = 1 | L2 | 3472 | 9 | 8, 8, 8, 8, 8, 8, 8, 16 | | | CPA7-CPJ7 = 111111101x |
| | | L1 | 28 | 8 | | | | |
| 4000 | EN8 = 1 | L2 | 3906 | 8 | | | | CPA8-CPJ8 = 1xxxxxxxxx |
| | | L1 | 94 | 8 | | | | |
| 4500 | EN9 = 1 | L2 | 3906 | 8 | | 4464 | 7 | CPA9-CPJ9 = 1111110xxx |
| | | L1 | 594 | 8 | | 36 | 8 | |
| 5000 | EN10 = 1 | L2 | 3906 | 8 | | 5208 | 6 | CPA10-CPJ10 = 110xxxxxxx |
| | | L1 | 1094 | 8 | | −208 | 8 | |
| 5500 | EN11 = 1 | L2 | 3906 | 8 | | 5208 | 6 | CPA11-CPJ11 = 110xxxxxxx |
| | | L1 | 1594 | 8 | | 292 | 8 | |

Examples of the operation of CDR circuit 100 are now described using some of the example values provided in Table 2. If PPM detector circuit 103 generates logic states in signals P4, P3, P2, and P1 of 0001, respectively, PPM step enable decoder circuit 901 generates a logic high state in enable signal EN1, and preset/NCLR manipulator circuit 902 causes the logic states of preset signals PRST0-PRST9 to equal 00000001xx, respectively, and the logic states of not clear signals NCLR0-NCLR9 to equal 00000001xx, respectively. Multiplexer select signal generation circuit 1501 generates a logic state in the select signal M2 that causes multiplexer circuit 1412 to provide the logic state of the select signal SEL from the Q output of flip-flop circuit 1410 to the D input of flip-flop circuit 1403. Flip-flop circuits 1401-1402 are not coupled in the shift register ring circuit 903 in this example. Multiplexer select signal generation circuit 1501 generates logic states in select signals M3-M9 that cause multiplexer circuits 1413-1419 to provide the signals at the Q outputs of flip-flop circuits 1403-1409 to the D inputs of flip-flop circuits 1404-1410, respectively.

Signal PRST7 causes flip-flop circuit 1403 to preset the signal at its Q output to a logic high state. Signals NCLR6-NCLR0 cause flip-flop circuits 1404-1410 to clear the signals at their Q outputs to logic low states, respectively. Eight bits having logic states 00000001 are shifted through flip-flop circuits 1403-1410 and multiplexer circuits 1412-1419 in response to clock signal CLKCT. Thus, select signal SEL equals the 8 logic states 00000001 in eight consecutive periods of clock signal CLKCT. Select signal SEL equals 00000001 in each subsequent set of 8 periods of clock signal CLKCT (i.e., 0000000100000001 . . . ), until PPM step enable decoder circuit 901 generates new values for enable signals EN0-EN11.

Referring to FIG. 16, the logic states that multiplexer circuits 1601-1604 generate in signals UP2O1, UP2O0, DN2O1, and DN2O0, respectively, are determined in part by the logic state of the select signal SEL. During jumps of plus 1 step or minus 1 step in the phases of the recovered clock signals, the output signal J2 of NAND gate circuit 1624 is in a logic low state. When the SEL signal and the J2 signal are in logic low states (0), multiplexer circuits 1601-1604 generate logic states of 0000 in signals UP2O1, UP2O0, DN2O1, and DN2O0, respectively. When the SEL signal is in a logic high state (1), multiplexer circuits 1601 and 1603 generate logic states of 00 in signals UP2O1 and DN2O1, respectively, and multiplexer circuits 1602 and 1604 cause the logic states of signals UP2O0 and DN2O0 to equal the logic states of input signals UP2I and DN2I, respectively.

In another example that is based on the embodiment of Table 2, if PPM detector circuit 103 generates logic states in signals P4, P3, P2, and P1 of 0101, respectively, PPM step enable decoder circuit 901 generates a logic high state in enable signal EN5, and preset/NCLR manipulator circuit 902 causes the logic states of preset signals PRST0-PRST9 to equal 101xxxxxxx, respectively, and the logic states of not clear signals NCLR0-NCLR9 to equal 101xxxxxxx, respectively, as shown in Table 2. Multiplexer select signal generation circuit 1501 generates a logic state in select signal M7 that causes multiplexer circuit 1417 to provide the select signal SEL from the Q output of flip-flop circuit 1410 to the D input of flip-flop circuit 1408. Flip-flop circuits 1401-1407 are not coupled in the shift register ring circuit 903 in this example. Multiplexer select signal generation circuit 1501 generates logic states in select signals M8-M9 that cause multiplexer circuits 1418-1419 to provide the signals at the Q outputs of flip-flop circuits 1408-1409 to the D inputs of flip-flop circuits 1409-1410, respectively.

Signals PRST0 and PRST2 cause flip-flop circuits 1410 and 1408 to preset the signals at their Q outputs to logic high states, respectively. Signal NCLR1 causes flip-flop circuit 1409 to clear the signal at its Q output to a logic low state. Three bits having logic states of 101 are shifted through flip-flop circuits 1408-1410 and multiplexer circuits 1417-1419 in response to clock signal CLKCT. Select signal SEL equals the 3 logic states 101 in 3 consecutive periods of clock signal CLKCT. Select signal SEL equals 101 in each subsequent set of 3 periods of clock signal CLKCT (i.e., 101101101 . . . ), until PPM step enable decoder circuit 901 generates new values for enable signals EN0-EN11.

According to other embodiments, preset signals PRST9-PRST0 and not clear signals NCLR9-NCLR0 cause flip-flop circuits 1401-1410 to store signals that have a repeating pattern of logic states. For example, if PPM step enable decoder circuit 901 generates a logic high state in enable signal EN5 and the period of clock signal CLKCT equals 8 UI, preset/NCLR manipulator circuit 902 causes the logic states of preset signals PRST0-PRST9 to equal 101101101x, respectively, and the logic states of not clear signals NCLR0-NCLR9 to equal 101101101x, respectively. In this embodiment, multiplexer circuit 1411 causes the signal at the D input of flip-flop circuit 1402 to equal the logic state of select signal SEL based on signal M1. Flip-flop circuit 1401 is not coupled in the shift register ring circuit 903. Multiplexer select signal generation circuit 1501 generates logic states in select signals M2-M9 that cause multiplexer circuits 1412-1419 to provide the signals at the Q outputs of flip-flop circuits 1402-1409 to the D inputs of flip-flop circuits 1403-1410, respectively. Signals PRST0, PRST2, PRST3, PRST5, PRST6, and PRST8 cause flip-flop circuits 1410, 1408, 1407, 1405, 1404, and 1402 to preset the signals at their Q outputs to logic high states, respectively. Signals NCLR1, NCLR4, and NCLR7 cause flip-flop circuits 1409, 1406, and 1403 to clear the signals at their Q outputs to logic low states. Nine bits having logic states 101101101 are shifted through flip-flop circuits 1402-1410 and multiplexer circuits 1411-1419 in response to clock signal CLKCT. Select signal SEL equals logic states 101101101 in 9 consecutive periods of clock signal CLKCT.

When PPM step enable decoder circuit 901 causes one of enable signals EN9-EN11 to be in a logic high state, CDR circuit 100 generates jumps of plus or minus 2 steps in the phases of the recovered clock signals, as shown in the seventh and eighth columns of Table 2. CDR circuit 100 generates jumps of 2 steps in the phases of the recovered clock signals for PPM corrections of 4500, 5000, and 5500. In the embodiment of Table 2, control signals PP1-PP3 shown in FIG. 16 equal the logic states of enable signals EN9-EN11, respectively. When one of control signals PP1-PP3 is in a logic high state, NAND gate 1624 causes signal J2 to be in a logic high state. When signal J2 is in a logic high state, AND gate 1611 causes the signal at the 0 input of multiplexer circuit 1601 to equal the logic state of signal UP2I, and AND gate 1612 causes the signal at the 0 input of multiplexer circuit 1603 to equal the logic state of signal DN2I. Thus, when select signal SEL is in a logic low state and signal J2 is in a logic high state, multiplexer circuits 1601 and 1603 cause output signals UP2O1 and DN2O1 to equal the logic states of input signals UP2I and DN2I, respectively, and multiplexer circuits 1602 and 1604 cause output signals UP2O0 and DN2O0 to be in logic low states.

Figure 17:
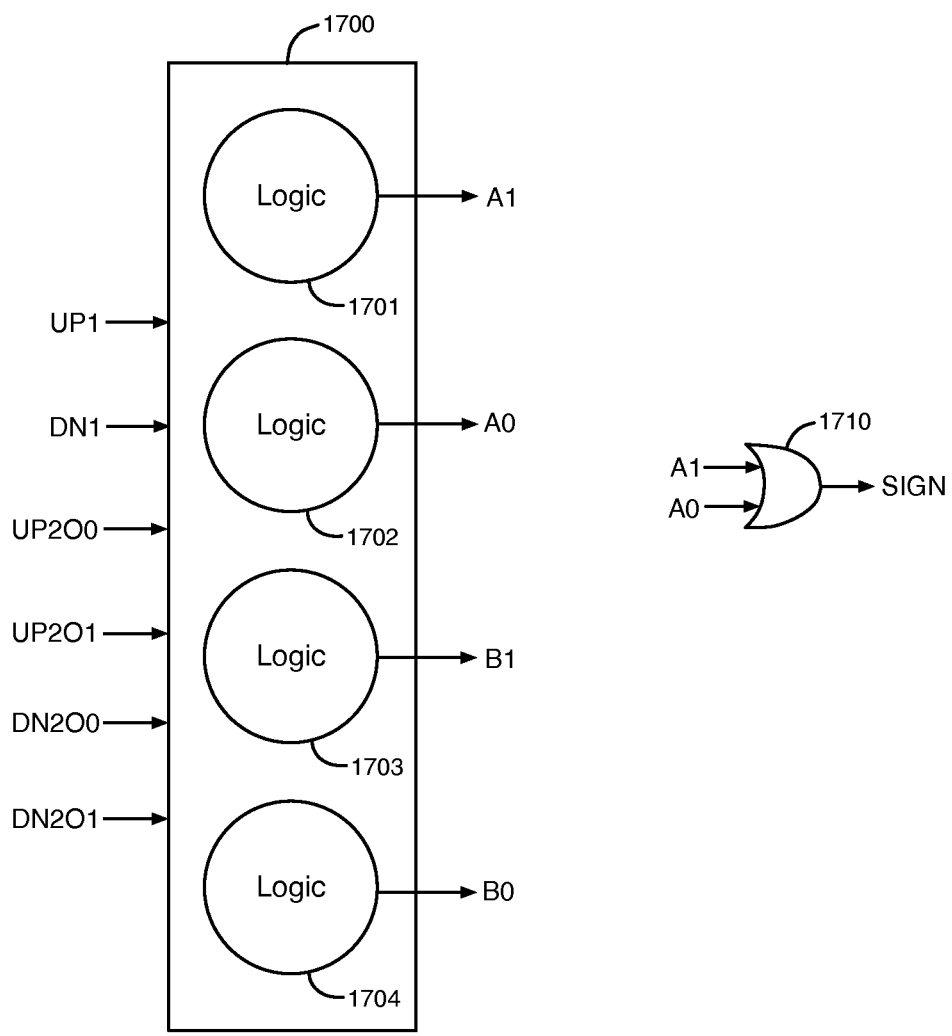
FIG. 17 illustrates the summation circuit of FIG. 1, according to an embodiment of the present invention.

FIG. 17 illustrates summation circuit 105, according to an embodiment of the present invention. Summation circuit 105 includes logic circuit 1700 and OR gate 1710. Logic circuit 1700 includes logic circuits 1701-1704. Signals UP1 and DN1 are provided to inputs of logic circuit 1700 from digital filter circuit 102. Signals UP2O1, UP2O0, DN2O1, and DN2O0 are provided to inputs of logic circuit 1700 from PPM decoder circuit 104. Logic circuits 1701-1704 generate output signals A1, A0, B1, and B0, respectively, based on the logic states of input signals UP1, DN1, UP2O1, UP2O0, DN2O1, and DN2O0, as shown below in Table 3. OR gate 1710 generates the SIGN signal based on the logic states of signals A0 and A1, as shown below in Table 3.

TABLE 3

| UP1 | UP2O1 | UP2O0 | DN1 | DN2O1 | DN2O0 | SIGN | A1 | A0 | B1 | B0 |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 0 | 1 | 0 | 0 | 0 | 0 | 1 |
| 0 | 0 | 0 | 0 | 1 | 0 | 0 | 0 | 0 | 1 | 0 |
| 0 | 0 | 0 | 1 | 0 | 0 | 0 | 0 | 0 | 0 | 1 |
| 0 | 0 | 0 | 1 | 0 | 1 | 0 | 0 | 0 | 1 | 0 |
| 0 | 0 | 0 | 1 | 1 | 0 | 0 | 0 | 0 | 1 | 1 |
| 0 | 0 | 1 | 0 | 0 | 0 | 1 | 0 | 1 | 0 | 0 |
| 0 | 0 | 1 | 1 | 0 | 0 | 0 | 0 | 0 | 0 | 0 |
| 0 | 1 | 0 | 0 | 0 | 0 | 1 | 1 | 0 | 0 | 0 |
| 0 | 1 | 0 | 1 | 0 | 0 | 1 | 0 | 1 | 0 | 0 |
| 1 | 0 | 0 | 0 | 0 | 0 | 1 | 0 | 1 | 0 | 0 |
| 1 | 0 | 0 | 0 | 0 | 1 | 0 | 0 | 0 | 0 | 0 |
| 1 | 0 | 0 | 0 | 1 | 0 | 0 | 0 | 0 | 0 | 1 |
| 1 | 0 | 1 | 0 | 0 | 0 | 1 | 1 | 0 | 0 | 0 |
| 1 | 1 | 0 | 0 | 0 | 0 | 1 | 1 | 1 | 0 | 0 |

The output signals A1, A0, B1, B0, and SIGN generated by summation circuit 105 are provided to inputs of phase interpolator control circuit 106, as shown in FIG. 1. Phase interpolator control circuit 106 generates logic states in the PIC signals that are based on the logic states of signals A1, A0, B1, B0, and SIGN. Phase interpolator (PI) circuit 107 sets the phases of the recovered clock signals based on the PIC signals. The SIGN signal determines if CDR circuit 100 increases or decreases the phases of the recovered clock signals.

Table 4 below shows the net value (Net UP) of the UP1, UP2O1, and UP2O0 signals, the net value (Net DN) of the DN1, DN2O1, and DN2O0 signals, and the net value (Net UP & DN) of the UP1, UP2O1, UP2O0, DN1, DN2O1, and DN2O0 signals. The net value (Net UP & DN) corresponds to the phase shifts that CDR circuit 100 provides to the recovered clock signals in response to signals UP1, UP2O1, UP2O0, DN1, DN2O1, and DN2O0 having the corresponding logic states shown in Table 4.

TABLE 4

| UP1 | UP2O1 | UP2O0 | Net UP | DN1 | DN2O1 | DN2O0 | Net DN | Net UP & DN |
|---|---|---|---|---|---|---|---|---|
| 0 | 0 | 0 | 0 | 0 | 0 | 0 | 0 | 0 |
| 0 | 0 | 0 | 0 | 0 | 0 | 1 | 1 | -1 |
| 0 | 0 | 0 | 0 | 0 | 1 | 0 | 2 | -2 |
| 0 | 0 | 0 | 0 | 1 | 0 | 0 | 1 | -1 |
| 0 | 0 | 0 | 0 | 1 | 0 | 1 | 2 | -2 |
| 0 | 0 | 0 | 0 | 1 | 1 | 0 | 3 | -3 |
| 0 | 0 | 1 | 1 | 0 | 0 | 0 | 0 | 1 |
| 0 | 0 | 1 | 1 | 1 | 0 | 0 | 1 | 0 |
| 0 | 1 | 0 | 2 | 0 | 0 | 0 | 0 | 2 |
| 0 | 1 | 0 | 2 | 1 | 0 | 0 | 1 | 1 |
| 1 | 0 | 0 | 1 | 0 | 0 | 0 | 0 | 1 |
| 1 | 0 | 0 | 1 | 0 | 0 | 1 | 1 | 0 |
| 1 | 0 | 0 | 1 | 0 | 1 | 0 | 2 | -1 |
| 1 | 0 | 1 | 2 | 0 | 0 | 0 | 0 | 2 |
| 1 | 1 | 0 | 3 | 0 | 0 | 0 | 0 | 3 |

The phase shifts that phase interpolator (PI) circuit 107 generates in the recovered clock signals are cumulative. For example, if the net value (Net UP & DN) of the UP1, UP2O1, UP2O0, DN1, DN2O1, and DN2O0 signals equals +1, then 0, then +1 again, then 0 again, and then +1 a third time, PI control circuit 106 causes PI circuit 107 to generate phase shifts equivalent to +3 in each of the recovered clock signals. CDR circuit 100 can generate cumulative phase shifts in the recovered clock signals in the range of 0-5500 parts per million (PPM) of a UI in the DATA signal. Each phase shift of +1 that PI circuit 107 generates in each of the recovered clock signals equals 500 PPM or less of the UI of the DATA signal.

Table 5 below provides example values for the phase error corrections according to another embodiment of CDR circuit 100 in which clock signal CLKCT has a period equal to 6 unit intervals of the DATA signal. The first column of Table 5 lists 12 possible corrections that CDR circuit 100 can provide to the phases of the recovered clock signals as measured in parts per million (PPM) of a unit interval in the DATA signal. The second column of Table 5 lists which of the 12 enable signals EN0-EN11 is in a logic high state to enable CDR circuit 100 to provide the total correction listed in the corresponding row of the first column.

The fourth column of Table 5 identifies the correction (cor.) added to the phases of the recovered clock signals by the corresponding first and second feedback loop circuits in CDR circuit 100 as measured in parts per million (PPM) of a unit interval of the DATA signal. The fifth column of Table 5 identifies the correction (cor.) rate provided to the phases of the recovered clock signals by the corresponding first and second feedback loop circuits as measured in unit intervals (UI) of the DATA signal. The sixth column of Table 5 identifies the averaging in UI of the DATA signal for the correction rates in the fifth column that are not multiples of 6. The seventh column of Table 5 identifies the compensation patterns that are provided for signals PRST0-PRST9 and NCLR0-NCLR9, respectively, by selection circuits 1100A-1100J for each of the 12 possible corrections listed in Table 5. In the embodiment of Table 5, CDR circuit 100 does not perform jumps of 2 steps in the phases of the recovered clock signals, and the J2 signal in FIG. 16 is always in a logic low state.

TABLE 5

| | | | | Jump Plus/Minus 1 Step | | |
|---|---|---|---|---|---|---|
| PPM Cor. | EN0-EN11 | Loop | PPM Correction | Correction Rate (UI) | Averaging | Whole Averaging |
| 0 | EN0 = 1 | L2 | 0 | 0 | | CPA0-CPJ0 = 0xxxxxxxxx |
| | | L1 | 0 | 6 | | |
| 500 | EN1 = 1 | L2 | 521 | 60 | | CPA1-CPJ1 = 0000000001 |
| | | L1 | −21 | 6 | | |
| 1000 | EN2 = 1 | L2 | 1042 | 30 | | CPA2-CPJ2 = 00001xxxxx |
| | | L1 | −42 | 6 | | |
| 1500 | EN3 = 1 | L2 | 1302 | 24 | | CPA3-CPJ3 = 0001xxxxxx |
| | | L1 | 198 | 6 | | |
| 2000 | EN4 = 1 | L2 | 2083 | 15 | 12, 12, 18, 18 | CPA4-CPJ4 = 0101001001 |
| | | L1 | −83 | 6 | | |
| 2500 | EN5 = 1 | L2 | 2604 | 12 | | CPA5-CPJ5 = 01xxxxxxxx |
| | | L1 | −104 | 6 | | |
| 3000 | EN6 = 1 | L2 | 3125 | 10 | 6, 6, 18 | CPA6-CPJ6 = 11001xxxxx |
| | | L1 | −125 | 6 | | |
| 3500 | EN7 = 1 | L2 | 3472 | 9 | 6, 12 | CPA7-CPJ7 = 101xxxxxxx |
| | | L1 | 28 | 6 | | |
| 4000 | EN8 = 1 | L2 | 3906 | 8 | 6, 6, 12 | CPA8-CPJ8 = 1101xxxxxx |
| | | L1 | 94 | 6 | | |
| 4500 | EN9 = 1 | L2 | 4464 | 7 | 6, 6, 6, 6, 6, 12 | CPA9-CPJ9 = 1111101xxx |
| | | L1 | 36 | 6 | | |
| 5000 | EN10 = 1 | L2 | 5208 | 6 | | CPA10-CPJ10 = 1xxxxxxxxx |
| | | L1 | −208 | 6 | | |
| 5500 | EN11 = 1 | L2 | 5208 | 6 | | CPA11-CPJ11 = 1xxxxxxxxx |
| | | L1 | 292 | 6 | | |

Table 6 below provides example values for the phase error corrections according to another embodiment of CDR circuit 100 in which clock signal CLKCT has a period equal to 10 unit intervals of the DATA signal. The corrections listed in the fourth and fifth columns of Table 6 are for jumps of plus 1 step or minus 1 step in the phases of the recovered clock signals. The corrections listed in the seventh and eighth columns of Table 6 are for jumps of 2 steps in the phases of the recovered clock signals.

TABLE 6

| | | | Jump Plus/Minus 1 Step | | | Jump 2 Steps | | |
|---|---|---|---|---|---|---|---|---|
| PPM Cor. | EN0-EN11 | Loop | PPM Cor. | Cor. Rate (UI) | Averaging | PPM Cor. | Cor. Rate (UI) | Compensation patterns |
| 0 | EN0 = 1 | L2 | 0 | 0 | | | | CPA0-CPJ0 = 0xxxxxxxxx |
| | | L1 | 0 | 0 | | | | |
| 500 | EN1 = 1 | L2 | 521 | 60 | | | | CPA1-CPJ1 = 000001xxxx |
| | | L1 | −21 | 10 | | | | |
| 1000 | EN2 = 1 | L2 | 1042 | 30 | | | | CPA2-CPJ2 = 001xxxxxxx |
| | | L1 | −42 | 10 | | | | |
| 1500 | EN3 = 1 | L2 | 1563 | 20 | | | | CPA3-CPJ3 = 01xxxxxxxx |
| | | L1 | −63 | 10 | | | | |
| 2000 | EN4 = 1 | L2 | 2083 | 15 | 10, 20 | | | CPA4-CPJ4 = 101xxxxxxx |
| | | L1 | −83 | 10 | | | | |
| 2500 | EN5 = 1 | L2 | 2604 | 12 | 10, 10, 10, 10, 20 | | | CPA5-CPJ5 = 111101xxxx |
| | | L1 | −104 | 10 | | | | |
| 3000 | EN6 = 1 | L2 | 3125 | 10 | | | | CPA6-CPJ6 = 1xxxxxxxxx |
| | | L1 | −125 | 10 | | | | |

TABLE 6-continued

| PPM Cor. | EN0-EN11 | Loop | Jump Plus/Minus 1 Step | | | Jump 2 Steps | | Compensation patterns |
|---|---|---|---|---|---|---|---|---|
| | | | PPM Cor. | Cor. Rate (UI) | Averaging | PPM Cor. | Cor. Rate (UI) | |
| 3500 | EN7 = 1 | L2 | 3125 | 10 | | 3472 | 9 | CPA7-CPJ7 = 111111110x |
| | | L1 | 375 | 10 | | 28 | 10 | |
| 4000 | EN8 = 1 | L2 | 3125 | 10 | | 3906 | 8 | CPA8-CPJ8 = 1110xxxxxx |
| | | L1 | 875 | 10 | | 94 | 10 | |
| 4500 | EN9 = 1 | L2 | 3125 | 10 | | 4464 | 7 | CPA9-CPJ9 = 1111000xxx |
| | | L1 | 1375 | 10 | | 36 | 10 | |
| 5000 | EN10 = 1 | L2 | 3125 | 10 | | 5208 | 6 | CPA10-CPJ10 = 100xxxxxxx |
| | | L1 | 1875 | 10 | | −208 | 10 | |
| 5500 | EN11 = 1 | L2 | 3125 | 10 | | 5208 | 6 | CPA11-CPJ11 = 100xxxxxxx |
| | | L1 | 2375 | 10 | | 292 | 10 | |

In the embodiment of Table 6, CDR circuit 100 generates jumps of 2 steps in the phases of the recovered clock signals as shown in the seventh and eighth columns of Table 6 when PPM step enable decoder circuit 901 causes one of enable signals EN7-EN11 to be in a logic high state. CDR circuit 100 generates jumps of 2 steps in the phases of the recovered clock signals for PPM corrections of 3500, 4000, 4500, 5000, and 5500. In the embodiment of Table 6, control signals PP4-PP8 shown in FIG. 16 equal the logic states of enable signals EN7-EN11, respectively. When one of control signals PP4-PP8 is in a logic high state, NAND gate 1624 causes signal J2 to be in a logic high state, AND gate 1611 causes the signal at the 0 input of multiplexer circuit 1601 to equal the logic state of signal UP2I, and AND gate 1612 causes the signal at the 0 input of multiplexer circuit 1603 to equal the logic state of signal DN2I.

Figure 18:
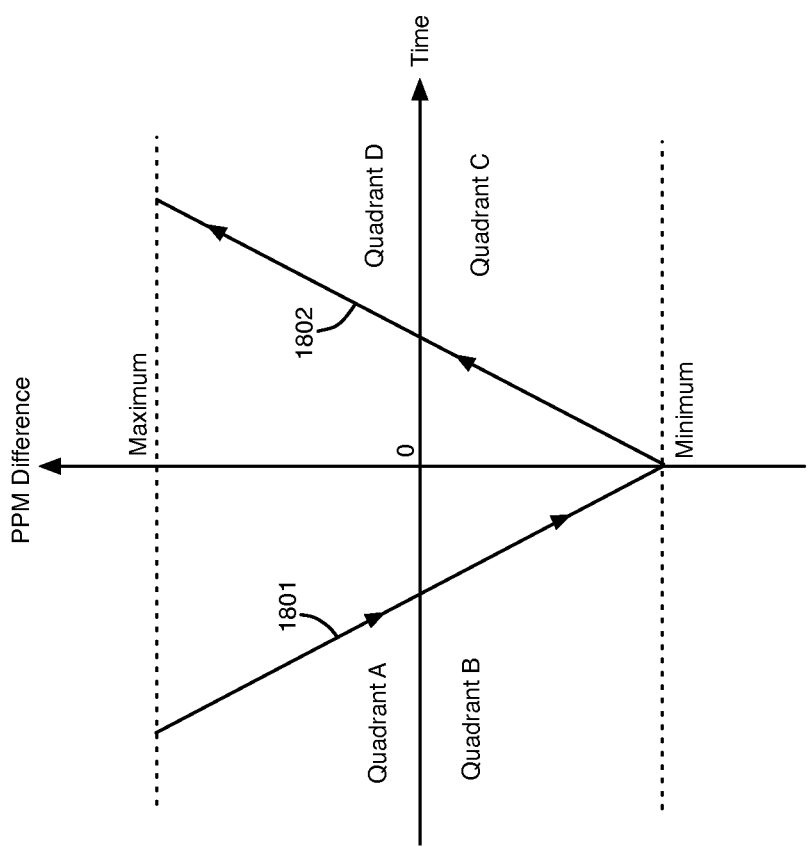
FIG. 18 is a graph that illustrates an example of the operation of the CDR circuit of FIG. 1, according to an embodiment of the present invention.

FIG. 18 is a graph that illustrates an example of the operation of CDR circuit 100, according to an embodiment of the present invention. The graph of FIG. 18 plots the difference in parts per million (PPM) between the phases of the recovered clock signals and the data rate of the DATA signal over time. Lines 1801-1802 in FIG. 18 show examples of changes in the phases of the recovered clock signals relative to the data rate of the DATA signal in parts per million (PPM) over time. The graph of FIG. 18 is divided into 4 quadrants referred to as quadrants A, B, C, and D.

In quadrant A, the PPM difference is positive indicating that the unit interval of the DATA signal is smaller than the periods of the recovered clock signals. CDR circuit 100 shifts the phases of the recovered clock signals to provide optimum sampling of the DATA signal by generating a logic high state in one of the DN2O0 or DN2O1 signals. Between the maximum PPM difference and a PPM difference of 0 along line 1801, the unit interval of the DATA signal is increasing, and as a result, the first feedback loop circuit generates more logic high states in signal UP1 than in signal DN1.

In quadrant B, the PPM difference is negative indicating that the unit interval of the DATA signal is larger than the periods of the recovered clock signals. CDR circuit 100 shifts the phases of the recovered clock signals by generating a logic high state in one of the UP2O0 or UP2O1 signals. Between a PPM difference of 0 and the minimum PPM difference along line 1801, the unit interval of the DATA signal is increasing, and as a result, the first feedback loop circuit generates more logic high states in signal UP1 than in signal DN1.

In quadrant C, the PPM difference is negative, and CDR circuit 100 shifts the phases of the recovered clock signals by generating a logic high state in one of the UP2O0 or UP2O1 signals. Between the minimum PPM difference and a PPM difference of 0 along line 1802, the unit interval of the DATA signal is decreasing, and as a result, the first feedback loop circuit generates more logic high states in signal DN1 than in signal UP1.

In quadrant D, the PPM difference is positive, and CDR circuit 100 shifts the phases of the recovered clock signals by generating a logic high state in one of the DN2O0 or DN2O1 signals. Between a PPM difference of 0 and the maximum PPM difference along line 1802, the unit interval of the DATA signal is decreasing, and as a result, the first feedback loop circuit generates more logic high states in signal DN1 than in signal UP1.

The second feedback loop circuit in CDR circuit 100 generates more accurate phase corrections in the recovered clock signals by averaging out random jitter in the filtered signals UP1 and DN1. The second feedback loop circuit provides compensation patterns that are optimized for each PPM phase step generated in the recovered clock signals. The second feedback loop circuit reduces the phase corrections in the recovered clock signals that need to be provided by the first feedback loop circuit. The bandwidth of the first feedback loop circuit can be reduced to sample the UP1 and DN1 signals more often in order to provide more accurate phase corrections in the recovered clock signals.

The second feedback loop circuit can be programmed by changing the frequencies of clock signals CLKCT and CLKLT and by changing the compensation pattern signals. CDR circuit 100 supports both down-spreading and up-spreading profiles of ±5000 PPM in the recovered clock signals using a spread spectrum clocking technique that tracks changes in the data rate of the DATA signal. In some embodiments, the compensation pattern signals are modified to achieve highly symmetrical compensation bit patterns that reduce dithering in CDR circuit 100.

Figure 19:
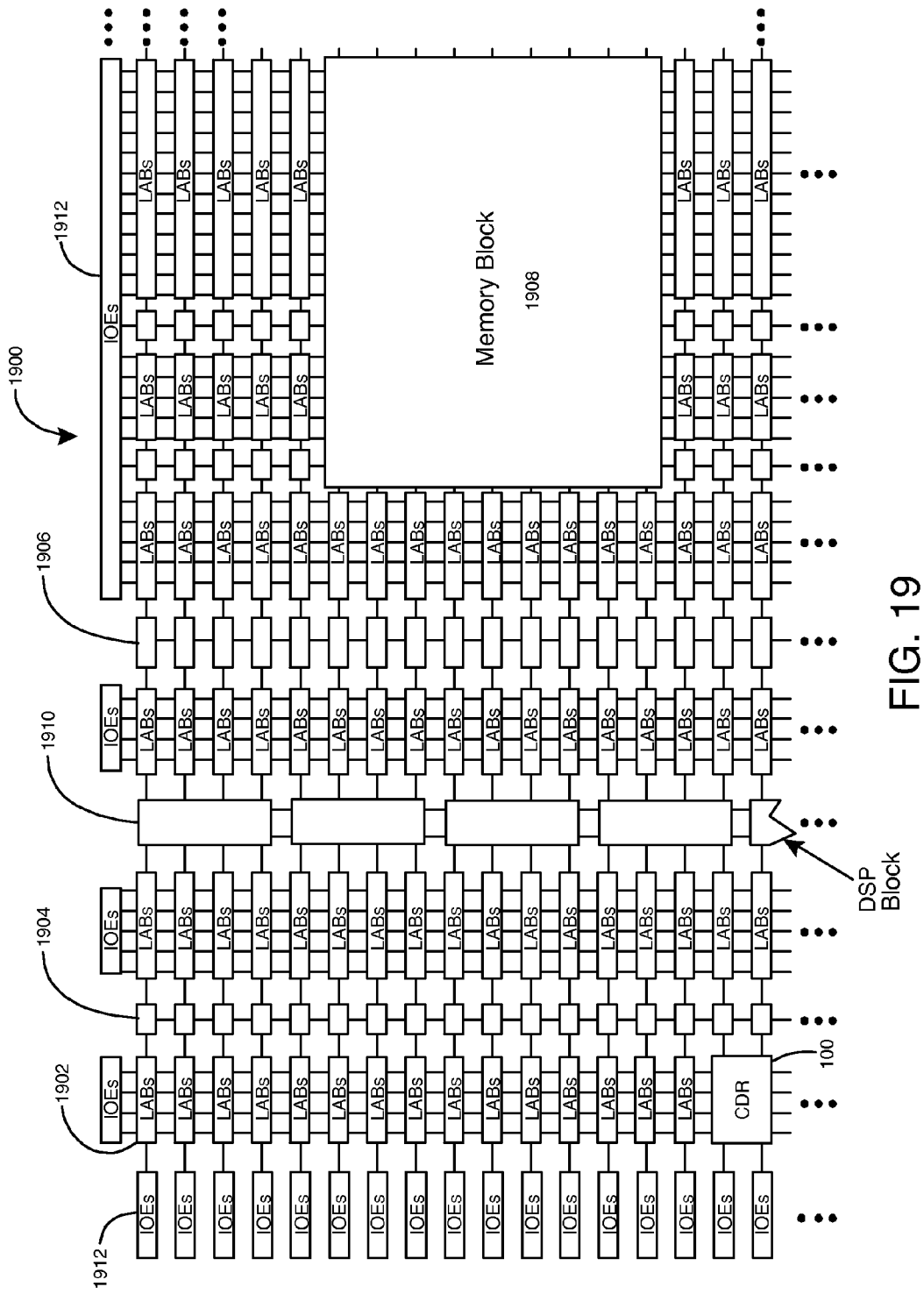
FIG. 19 is a simplified partial block diagram of a field programmable gate array (FPGA) that can include aspects of the present invention.

FIG. 19 is a simplified partial block diagram of a field programmable gate array (FPGA) 1900 that can include aspects of the present invention. FPGA 1900 is merely one example of an integrated circuit that can include features of the present invention. It should be understood that embodiments of the present invention can be made in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 1900 includes a two-dimensional array of programmable logic array blocks (or LABs) 1902 that are interconnected by a network of column and row interconnect conductors of varying length and speed. LABs 1902 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1900 also includes a distributed memory structure including random access memory (RAM) blocks of varying sizes provided throughout the array. The RAM blocks include, for example, blocks 1904, blocks 1906, and block 1908. These memory blocks can also include shift registers and first-in-first-out (FIFO) buffers.

FPGA 1900 further includes digital signal processing (DSP) blocks 1910 that can implement, for example, multipliers with add or subtract features. Input/output elements (IOEs) 1912 located, in this example, around the periphery of the chip, support numerous single-ended and differential input/output standards. IOEs 1912 include input and output buffers that are coupled to pins of the integrated circuit. The pins are external terminals of the FPGA die. Signals such as input signals, output signals, and supply voltages are routed between the FPGA and one or more external devices through the pins. FPGA 1900 also has a CDR circuit 100, which is shown in FIG. 1. It is to be understood that FPGA 1900 is described herein for illustrative purposes only and that the present invention can be implemented in many different types of integrated circuits.

Figure 20:
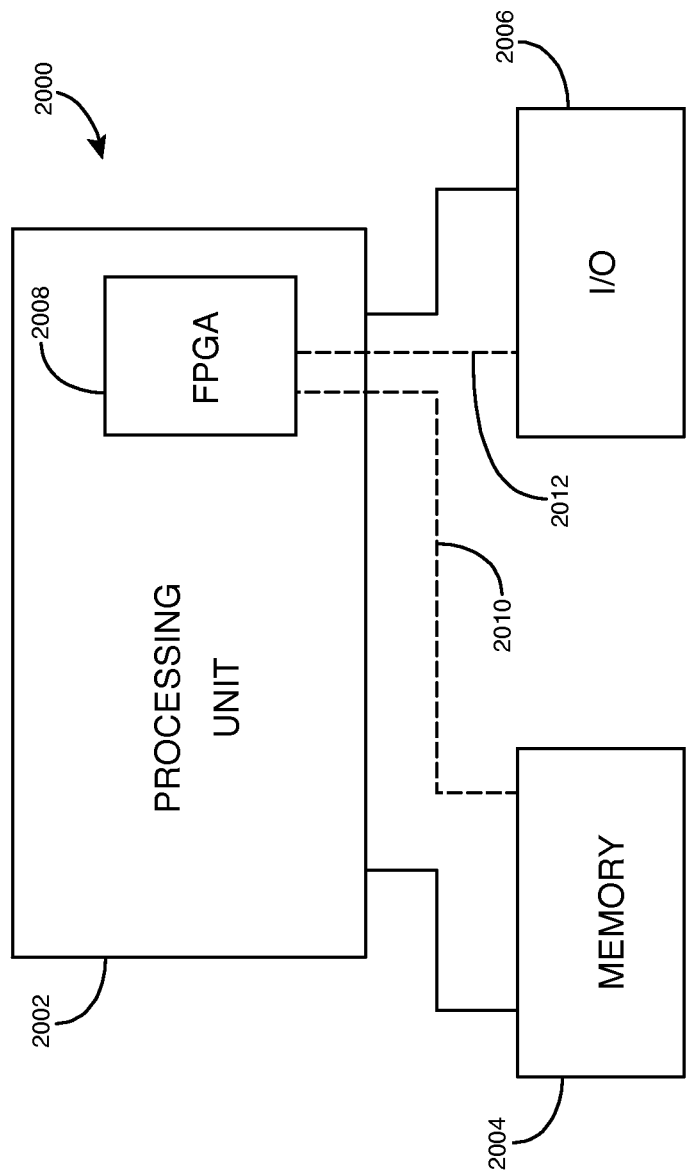
FIG. 20 shows a block diagram of an exemplary digital system that can embody techniques of the present invention.

The present invention can also be implemented in a system that has an FPGA as one of several components. FIG. 20 shows a block diagram of an exemplary digital system 2000 that can embody techniques of the present invention. System 2000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 2000 can be provided on a single board, on multiple boards, or within multiple enclosures.

System 2000 includes a processing unit 2002, a memory unit 2004, and an input/output (I/O) unit 2006 interconnected together by one or more buses. According to this exemplary embodiment, an FPGA 2008 is embedded in processing unit 2002. FPGA 2008 can serve many different purposes within the system of FIG. 20. FPGA 2008 can, for example, be a logical building block of processing unit 2002, supporting its internal and external operations. FPGA 2008 is programmed to implement the functions necessary to carry on its particular role in system operation. FPGA 2008 can be specially coupled to memory 2004 through connection 2010 and to I/O unit 2006 through connection 2012.

Processing unit 2002 can direct data to an appropriate system component for processing or storage, execute a program stored in memory 2004, receive and transmit data via I/O unit 2006, or other similar functions. Processing unit 2002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 2008 can control the logical operations of the system. As another example, FPGA 2008 acts as a reconfigurable processor that can be reprogrammed as needed to handle a particular computing task. Alternatively, FPGA 2008 can itself include an embedded microprocessor. Memory unit 2004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A clock data recovery circuit comprising:
 a phase detector circuit to generate a phase error signal based on a periodic signal and a data signal;
 a filter circuit to generate a first filtered signal based on the phase error signal; and
 a phase interpolator circuit to generate the periodic signal, wherein a phase of the periodic signal is adjustable based on the first filtered signal in response to variations in a data rate of the data signal using spread-spectrum clocking, wherein the phase of the periodic signal tracks changes in the data rate of the data signal.

2. The clock data recovery circuit of claim 1, wherein the phase of the periodic signal is adjustable based on the first filtered signal by at least 1500 parts per million of a unit interval of the data signal, wherein the data rate of the data signal varies according to a spread spectrum technique.

3. The clock data recovery circuit of claim 1, wherein the phase of the periodic signal is adjustable based on the first filtered signal by at least 2500 parts per million of a unit interval of the data signal.

4. The clock data recovery circuit of claim 1, wherein the phase of the periodic signal is adjustable based on the first filtered signal by at least 3500 parts per million of a unit interval of the data signal.

5. The clock data recovery circuit of claim 1, wherein the phase of the periodic signal is adjustable based on the first filtered signal by at least 4500 parts per million of a unit interval of the data signal.

6. The clock data recovery circuit of claim 1 further comprising:
 a counter circuit to generate count signals based on the first filtered signal;
 storage circuits to store signals that are selected based on the count signals; and
 a first multiplexer circuit to select a first signal based on the first filtered signal in first intervals that are determined by the stored signals, wherein the clock data recovery circuit adjusts the phase of the periodic signal based on the first selected signal and the first filtered signal.

7. The clock data recovery circuit of claim 6, wherein the filter circuit generates a second filtered signal based on the phase error signal, and wherein the clock data recovery circuit further comprises:
- a second multiplexer circuit to select a second signal based on the second filtered signal in second intervals that are determined by the stored signals, wherein the second multiplexer circuit selects the second signal based on a constant voltage in third intervals that are determined by the stored signals, and wherein the periodic signal is adjustable based on the first and the second selected signals and the first filtered signal.

8. The clock data recovery circuit of claim 6 further comprising:
- a second multiplexer circuit to select a second signal based on the first filtered signal in second intervals that are determined by the stored signals.

9. The clock data recovery circuit of claim 6 further comprising:
- second multiplexer circuits, wherein each of the second multiplexer circuits is coupled to two of the storage circuits, and wherein the second multiplexer circuits couple the storage circuits in a shift register ring.

10. A circuit comprising:
- a phase detector circuit to generate a phase error signal based on a periodic signal and an input signal;
- a filter circuit to generate a first filtered signal based on the phase error signal;
- a first counter circuit to generate first count signals based on the first filtered signal;
- first storage circuits to store first signals based on the first count signals;
- a first multiplexer circuit to select a first signal based on the first filtered signal in first intervals that are determined by the first stored signals; and
- a phase interpolator circuit to adjust a phase of the periodic signal based on the first selected signal and the first filtered signal.

11. The circuit of claim 10 further comprising:
- a second multiplexer circuit to select a second signal based on the first filtered signal in second intervals that are determined by the first stored signals, wherein the second multiplexer circuit selects the second signal based on a fixed signal in third intervals that are determined by the first stored signals, and wherein the periodic signal is adjustable based on the first and the second selected signals and the first filtered signal.

12. The circuit of claim 10 further comprising:
- second multiplexer circuits, wherein each of the second multiplexer circuits is coupled to two of the first storage circuits, and wherein the second multiplexer circuits couple the first storage circuits in a shift register ring.

13. The circuit of claim 10 further comprising:
- second multiplexer circuits to generate preset signals and clear signals, wherein the preset signals are provided to preset inputs of the first storage circuits, wherein the clear signals are provided to clear inputs of the first storage circuits, and wherein the first storage circuits store the first stored signals based on the preset signals and the clear signals.

14. The circuit of claim 13 further comprising:
- transistors to select compensation pattern signals based on the first count signals, wherein the compensation pattern signals selected by the transistors are provided to multiplexing inputs of the second multiplexer circuits, and wherein the second multiplexer circuits generate the preset signals and the clear signals based on the compensation pattern signals.

15. The circuit of claim 10 wherein the filter circuit generates a second filtered signal based on the phase error signal, and wherein the circuit further comprises:
- a second multiplexer circuit to select a second signal based on the second filtered signal in second intervals that are determined by the first stored signals, wherein the second multiplexer circuit selects the second signal based on a fixed signal in third intervals that are determined by the first stored signals, and wherein the phase of the periodic signal is adjustable based on the first and the second selected signals and the first filtered signal.

16. The circuit of claim 15 further comprising:
- a summation circuit to generate control signals based on the first and second selected signals, wherein the phase of the periodic signal is adjustable based on the control signals.

17. The circuit of claim 10 further comprising:
- a second counter circuit to generate second count signals based on the first filtered signal, wherein the first storage circuits store the first stored signals based on the first and second count signals; and
- a third counter circuit to generate third count signals based on the first filtered signal, wherein the first counter circuit varies the first count signals based on the third count signals.

18. The circuit of claim 10 further comprising:
- second storage circuits to store second signals having values that are based on the first count signals in response to a clock signal that determines a latency in the circuit, wherein the first stored signals stored by the first storage circuits are based on the second stored signals.

19. A method comprising:
- comparing phases of a periodic signal and a data signal to generate a phase error signal using a phase detector circuit;
- filtering the phase error signal to generate a filtered signal;
- generating the periodic signal using a phase interpolator circuit; and
- adjusting a phase of the periodic signal based on the filtered signal in response to variations in a data rate of the data signal using spread-spectrum clocking, wherein the adjusting tracks changes in the data rate of the data signal.

20. The method of claim 19, wherein the adjusting comprises adjusting the phase of the periodic signal based on the filtered signal by at least 1500 parts per million of a unit interval of the data signal using the phase interpolator circuit.

21. The method of claim 19, wherein the adjusting comprises adjusting the phase of the periodic signal based on the filtered signal by at least 5000 parts per million of a unit interval of the data signal using the phase interpolator circuit.

22. The method of claim 19 further comprising:
- generating count signals based on the filtered signal;
- storing signals that are based on the count signals in storage circuits;
- selecting a first signal based on the filtered signal in first intervals that are determined by the stored signals,
- wherein the adjusting comprises adjusting the phase of the periodic signal based on the filtered signal and the first selected signal.

23. The method of claim 22 further comprising:
- coupling the storage circuits into a shift register ring in response to select signals generated based on the count signals.

24. The method of claim 22 further comprising:
selecting a second signal based on the filtered signal in second intervals that are determined by the stored signals; and
selecting the second signal based on a fixed signal in third intervals that are determined by the stored signals,
wherein the adjusting comprises adjusting the phase of the periodic signal based on the first and second selected signals and the filtered signal.

* * * * *